(12) United States Patent
Ari et al.

(10) Patent No.: US 10,988,620 B2
(45) Date of Patent: Apr. 27, 2021

(54) COMPOSITE ELEMENT COMPRISING A BIPHASIC SILICA AND CARBON NANOTUBE-BASED MATERIAL

(71) Applicant: Luxembourg Institute Of Science And Technology (LIST), Esch/Alzette (LU)

(72) Inventors: Didier Ari, Metz (FR); Damien Lenoble, Wellin (BE); Mouhamadou Moustapha Sarr, Strasbourg (FR)

(73) Assignee: Luxembourg Institute of Science and Technology (LIST)

( * ) Notice: Subject to any disclaimer, the term of this patent is extended or adjusted under 35 U.S.C. 154(b) by 0 days.

(21) Appl. No.: 15/739,266

(22) PCT Filed: Jun. 21, 2016

(86) PCT No.: PCT/EP2016/064244
§ 371 (c)(1),
(2) Date: Dec. 22, 2017

(87) PCT Pub. No.: WO2016/207129
PCT Pub. Date: Dec. 29, 2016

(65) Prior Publication Data
US 2018/0187020 A1 Jul. 5, 2018

(30) Foreign Application Priority Data

Jun. 24, 2015 (EP) .................................... 15173721

(51) Int. Cl.
*C09C 1/30* (2006.01)
*C01B 32/16* (2017.01)
(Continued)

(52) U.S. Cl.
CPC .............. *C09C 1/3054* (2013.01); *B60C 1/00* (2013.01); *C01B 32/16* (2017.08); *C01B 32/162* (2017.08); *C08J 3/203* (2013.01);
*C08L 9/06* (2013.01); *C08L 33/12* (2013.01); *H01B 1/04* (2013.01); *H01B 1/20* (2013.01); *B82Y 30/00* (2013.01); *B82Y 40/00* (2013.01); *C01P 2006/40* (2013.01); *C08J 2309/06* (2013.01);
(Continued)

(58) Field of Classification Search
CPC ....... C01B 32/162; C01B 32/16; B82Y 30/00; B82Y 40/00; C08J 3/203
USPC .......................... 252/500, 502, 506, 510, 511
See application file for complete search history.

(56) References Cited

U.S. PATENT DOCUMENTS

| | | | |
|---|---|---|---|
| 2004/0149209 A1* | 8/2004 | Dai ........................ | B82Y 30/00 118/715 |
| 2010/0240529 A1* | 9/2010 | Balzano .................. | B01J 23/88 502/159 |
| 2014/0295178 A1* | 10/2014 | Watanabe .............. | B01J 23/755 428/338 |

OTHER PUBLICATIONS

Murukami "Single-walled carbon nanotubes catalytically grown from mesoporous silica thin film." Chemical Physics Letters 375 (2003) 393-398 (Year: 2003).*

(Continued)

*Primary Examiner* — Tri V Nguyen
(74) *Attorney, Agent, or Firm* — Sandberg Phoenix and von Gontard

(57) ABSTRACT

A composite material comprising at least one polymer matrix. The polymer matrix comprises at least one inorganic load composed of a biphasic material that comprises at least one mesoporous substrate at least partially coated with carbon nanotubes. The composite material is remarkable in that the mesoporous substrate is composed of diatoms.

18 Claims, 29 Drawing Sheets

Figure 1:
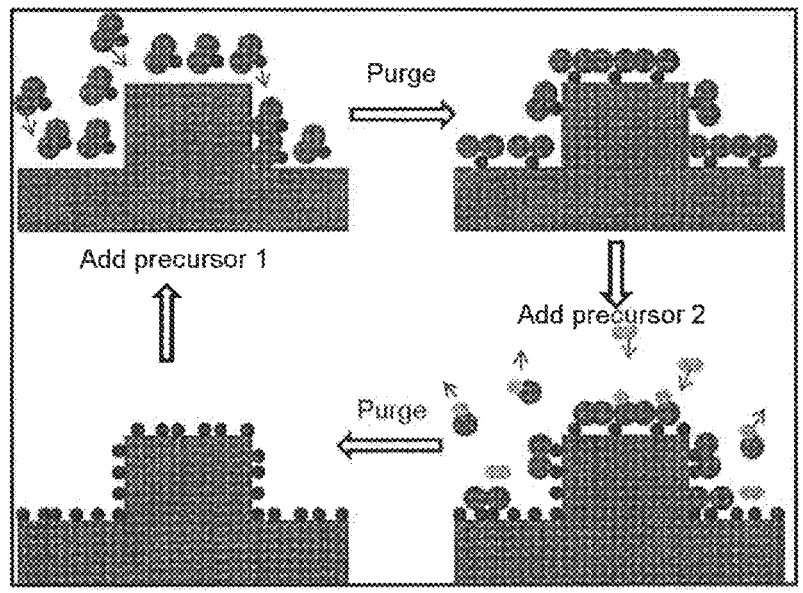

(51) Int. Cl.
*H01B 1/20* (2006.01)
*H01B 1/04* (2006.01)
*B82Y 30/00* (2011.01)
*B82Y 40/00* (2011.01)
*B60C 1/00* (2006.01)
*C01B 32/162* (2017.01)
*C08J 3/20* (2006.01)
*C08L 9/06* (2006.01)
*C08L 33/12* (2006.01)
*C23C 16/26* (2006.01)

(52) U.S. Cl.
CPC ........ *C08J 2333/12* (2013.01); *C08J 2409/06* (2013.01); *C08J 2433/12* (2013.01); *C08L 2203/20* (2013.01); *C23C 16/26* (2013.01); *Y10S 977/742* (2013.01); *Y10S 977/753* (2013.01); *Y10S 977/843* (2013.01)

(56) References Cited

OTHER PUBLICATIONS

Sanhueza "Synthesis of a mesoporous material from two natural sources." Journal of Chemical Technology and Biotechnology, vol. 81, Issue: 4, pp. 614-617 (Year: 2006).*
Othman "Synthesis and characterisation of silica-carbon nanotube hybrid microparticles and their effect on the electrical properties of poly(vinyl alcohol) composites." Carbon, 60, 461-470 (Year: 2013).*
International Search Report for corresponding PCT/EP2016/064244 dated Sep. 13, 2016.
Written Opinion for corresponding PCT/EP2016/064244 dated Sep. 13, 2016.
Wang Hong et al. "Catalysts for Chirality Selective Synthesis of Single-Walled Carbon Nanotubes", Elsevier, Oxford, GB, vol. 81 Sep. 28, 2014 pp. 1-19.
Wei-De Zhang et al. "Polymer Nanocomposites Using Urchin-Shaped Carbon Nanotube-Silica Hybrids as Reinforcing Fillers", Macromolecular Rapid Communications, vol. 25, No. 21, Nov. 3, 2004, pp. 1860-1864.
Li Chunhua et al. "Science in China (Series E) Synthesis of Carbon Nanotubes with Ni/CNTs Catalyst" Jun. 30, 2003.
Solanki R et al. "Atomic Layer Deposition of Copper Seed Layers", Electrochemical and Solid-State Letters, vol. 3, No. 10, Oct. 1, 2000, pp. 479-480.
G. Abrasonis, et al. "X-ray Spectroscopic and Magnetic Investigation of C:Ni Nanocomposite Films Grown by Ion Beam Cosputtering." J. Phys. Chem. C 2008, 112, 12628-12637.
Marius C. Costache, et al. "The thermal degradation of poly(methyl methacrylate)nanocomposites with montmorillonite, layered double hydroxides and carbon nanotubes." Polym. Adv. Technol. 2006; 17: 272-280.
El-Shazly M. Duraia, et al. "Growth of carbon nanotubes on diatomite." Vacuum 84 (2010) 464-468.
Maoshuai He, et al. "Low Temperature Growth of SWNTs on a Nickel Catalyst by Thermal Chemical Vapor Deposition." Nano Res. 2011, 4(4): 334-342 ISSN 1998-0124.
Prashant Jindal, et al. "Mechanical characterization of PMMA/MWCNT composites under static and dynamic loading conditions." Materials Today: Proceedings 2 ( 2015 ) 1364-1372.
Shailaja Pande, et al. "Synthesis and Characterization of Multiwalled Carbon Nanotubes-Polymethyl Methacrylate Composites Prepared by in Situ Polymerization Method." Polymer Composites—2009 1312-1317.
Peter Antony Premkumar, et al. "Effect of Solvent on the Growth of Co and Co2C Using Pulsed-Spray Evaporation Chemical Vapor Deposition." Chem. Mater. 2007, 19, 6206-6211.
Peter Antony Premkumar, et al. "CVD of Metals Using Alcohols and Metal Acetylacetonates, Part I: Optimization of Process Parameters and Electrical Characterization of Synthesized Films." Chemical Vapor Deposition 2007, 13, 219-226.
B.B. Troitskii, et al. "Inhibition of thermo-oxidative degradation of poly(methyl methacrylate) and polystyrene by C60." European Polymer Journal 36 (2000) 1073-1084.
Tianxi Liu, et al. "Morphology and Mechanical Properties of Multiwalled Carbon Nanotubes Reinforced Nylon-6 composites." Macromolecules 2004, 37, 7214-7222.
Jinchao Zhao, et al. "Effect of silica coating thickness on the thermal conductivity of polyurethane/SiO2 coated multiwalled carbon nanotube composites." Composites: Part A 58 (2014) 1-6.

* cited by examiner

COMPOSITE ELEMENT COMPRISING A BIPHASIC SILICA AND CARBON NANOTUBE-BASED MATERIAL

CROSS-REFERENCE TO RELATED APPLICATIONS

The present invention is the US national stage under 35 U.S.C. § 371 of International Application No. PCT/EP2016/064244, which was filed on Jun. 21, 2016, and which claims the priority of application EP 15173721.0 filed on Jun. 24, 2015, the content of which (text, drawings and claims) are incorporated here by reference in its entirety.

FIELD

The invention relates to a composite element comprising a strengthening agent based on a biphasic silica-based material, particularly based on diatoms, and carbon nanotubes.

BACKGROUND

Diatoms are microscopic unicellular aquatic organisms that have a siliceous cell wall (50 nm thick). They have different shapes and sizes varying between 1 and 10 microns and the silica in diatoms is constituted of nano-pores, self-organized nano-channels, which gives them a large specific surface area of the order of 3 to 200 $m^2/g$. This large specific surface area offers the possibility of making a high density of carbon nanotubes (CNTs) as well as having a large contact surface with the matrix.

Diatomites are Defined as Siliceous Rock of Organic Origin.

Producing a biphasic CNT/diatom silica material is a technological challenge to take up in so far as diatoms are structures with complex shapes and because growing carbon nanotubes requires several steps according to the growth method chosen.

It is supposed that using CNTs to replace carbon black (amorphous carbon) in composite materials will boost the emergence of new materials with all sorts of new interesting properties.

Indeed, CNTs are known to have better properties than carbon black. Improved wear resistance and/or better retention of mechanical properties may be cited, among others.

Methods for chemical deposit in the vapour phase allow the deposit of films or nanoparticles onto substrates from precursors injected near the substrate in the gas phase. The principle consists in putting the precursors, which may be liquid, solid or gas, in a gaseous form and making them react together to form a film or solid nanostructures on the substrate. The advantage of gas phase methods compared to liquid phase methods is being able to consider all types of substrates, including substrates having complex morphology, such as diatoms.

Atomic layer deposition (ALD) (see FIG. 1) consists in alternatively reacting the precursors at the surfaces of the substrates and presents the advantage of being the technique that leads to the highest coverage (He M., et al., *Nano Res.*, 2010, 4, 334-342).

The principle of ALD consists in alternatively injecting two precursors separated by a purge gas. The precursors may be solid, liquid or gas but they are transformed into vapour before being sent to the reaction chamber. The steps of the process for an ALD cycle are described as follows:

a. Introduction of precursor 1: regardless of its nature (solid, liquid or gas), this must be vaporized from its container and transported by an inert carrier gas to the reaction chamber. This precursor adsorbs on the surface of the substrate. The duration of exposure of the precursor is a parameter that influences the structure of the film since it is what modulates how the molecules saturate the surface of the precursors.

b. Purge: after precursor 1 is adsorbed onto the substrate, an inert gas is added to purge and evacuates the molecules that could not be adsorbed onto the surface to the pump.

c. Introduction of precursor 2: the vapour from precursor 2 (or reactant) is introduced into the chamber and is intended to react with the molecules of precursor 1 that are already adsorbed. The reaction product forms the first atomic layer of the film. This type of precursor is often a reducing agent, an oxidizing agent, a nitrosing agent, an agent that can remove a ligand from precursor 1 or provide a missing element.

d. Second purge: the chamber is purged again to evacuate all the by-products of the reaction between the two precursors.

The temperature, pressure, and number of cycles also influence the ALD technique.

A second method that is used to increase the carbon nanotubes is the method called chemical vapour deposition (CVD). The substrate is exposed to one or more precursors in the gas phase, which react and/or decompose on the surface of the substrate to generate the desired deposit.

A third method that may be envisaged is the vapour-impregnation method, which consists in saturating the surface of the substrate by the molecules intended to be grafted. In reality this method is a variant of CVD that is used when the substrate that has to be functionalized is fibrous in nature.

The formation of vertical carbon nanotubes has been reported (Duraia E. M., et al., *Vacuum*, 2010, 84, 464-468) (CNT) using diatomite as substrate, therefore combining the advantages of CNT (electric and optical properties) and those of diatomite (natural inexpensive material that is useful in water purification) in a single material. The technique of chemical vapour deposition assisted by microwave plasma was used for CNT growth on diatomite. A pre-treatment step was necessary before the growth step for CNTs whose main source of carbon is methane ($CH_4$).

Moreover, it has been reported (Zhao J., et al., *Composites: Part A*, 2014, 58; 1-6) that composite materials (synthesized by the sol-gel process) based on polyurethane and strengthened by silica and multi-wall CNTs can increase the thermal conductivity of the base material, i.e. polyurethane. By incorporating silica in the polymer matrix the polyurethane's electric resistivity can be maintained.

It has also been reported (Zhang W. D., et al., *Macromol. Rapid Commun.*, 2004, 25, 1860-1864) that nanocomposites based on nylon-6 strengthened by CNTs and mesoporous silica particles of the MCM-41 type can improve the Young's modulus and solidity of the material.

SUMMARY

The technical problem of the invention is to develop composite materials based on a polymer matrix and a strengthening agent presenting both a very high specific surface area and intrinsic properties in the carbon nanotubes that are better than the properties of carbon black.

In a general manner, by improving the interface between the polymer matrix and the strengthening agent, the stability of the composite materials will be increased. Using carbon nanotubes solves the problem in particular of supplying thermal, electric and/or mechanical properties in such composite materials.

The invention first relates to a composite material comprising at least one polymer matrix, the polymer matrix comprising at least one inorganic load composed of a biphasic material. The biphasic material comprises at least one mesoporous substrate at least partially coated with carbon nanotubes. The composite material of the present invention is remarkable in that the mesoporous substrate is a mesoporous substrate with non-organized porosity.

According to various embodiments the mesoporous substrate with non-organized porosity comprises silica from diatoms, in various instances diatomite.

According to various embodiments, the mesoporous substrate composition with non-organized porosity in the composite material is comprised between 1% and 30%, in various instances between 1% and 10%.

According to various embodiments, the composition of the mesoporous substrate with non-organized porosity in the composite material is 1%, 2%, 3%, 4%, 5%, 6%, 7%, 8%, 9% or 10%, in various instances 1%, 4% or 10%.

According to various embodiments, the polymer matrix is composed of polymethylmethacrylate and/or at least one elastomer, the elastomer being in various instances butadiene styrene rubber.

According to various embodiments, the thermal degradation temperature of the composite material with a polymer matrix composed of polymethylmethacrylate increases by 25° C. relative to the thermal degradation temperature of the polymethylmethacrylate.

According to various embodiments, the Young's modulus of the composite material with a polymer matrix composed of butadiene styrene rubber increases between 50% and 300% relative to the Young's modulus of butadiene styrene rubber.

According to various embodiments, the electrical conductivity of the composite material with a polymer matrix composed of butadiene styrene rubber and a composition of diatoms of 10% is $2.5 \cdot 10^{-14}$ S·cm$^{-1}$.

The invention also relates to the second subject of a process for synthesizing a composite material. The synthetic process comprises at least one extrusion step between at least one polymer matrix and at least one biphasic material. The synthetic process is remarkable in that the composite material is in accord with the first subject of the present invention.

According to various embodiments, the biphasic material is synthesized in two steps:
a. a step of providing a catalyst on at least one mesoporous substrate, the catalyst being configured to favour the growth of the carbon nanotubes, and
b. a step of growing the carbon nanotubes,
the two steps (a) and (b) are performed in a one-pot synthesis.

According to various embodiments, step (a) is performed by vapour impregnation of the catalyst, by chemical vapour deposition or by atomic layer deposition, in various instances by vapour impregnation of the catalyst.

According to various embodiments, the catalyst is a metal nanoparticle provided in a gas phase.

According to various embodiments, the catalyst is a nickel derivative, in various instances Ni(acac)$_2$, or a cobalt derivative, in various instances Co(acac)$_2$.

According to various embodiments, the catalyst is reduced by an alcohol derivative or by gaseous hydrogen.

According to various embodiments, the alcohol derivative is a primary alcohol, in various instances methanol, ethanol and/or propanol.

According to various embodiments, the catalyst and the alcohol derivative are applied simultaneously when the step of providing a catalyst on the at least one mesoporous substrate is performed by chemical vapour deposition.

According to various embodiments, the alcohol derivative is applied once the at least one catalyst is deposited on the at least one mesoporous substrate when the step of providing a catalyst on the at least one mesoporous substrate is performed by atomic layer deposition and/or atomic particle deposition.

According to various embodiments, the gaseous hydrogen is mixed with gaseous nitrogen or another inert gas.

According to various embodiments, the mixture of the gaseous hydrogen and the gaseous nitrogen comprises a portion of gaseous hydrogen that is comprised between 2% and 30%, in various instances between 10% and 20%.

According to various embodiments, the step of reducing the catalyst by gaseous hydrogen is performed for a period of between 2 minutes and 30 minutes, in various instances between 5 minutes and 20 minutes, for example between 10 minutes and 20 minutes, exemplarily for a period of 20 minutes.

According to various embodiments, the at least [one] mesoporous substrate is composed of a silica derivative, in various instances silica from diatoms or silicon, for example silica from diatoms.

According to various embodiments, the at least one silica derivative is thermally oxidized at 1100° C. to provide a layer of silicon dioxide 50 nm thick, before the step of providing a catalyst on the at least one mesoporous substrate.

According to various embodiments, the Ni(acac)$_2$ is sublimed at a temperature of between 150° C. and 190° C., in various instances at 180° C.

According to various embodiments, the Co(acac)$_2$ is sublimed at a temperature of between 150° C. and 190° C., in various instances at 170° C.

According to various embodiments, the one-pot synthesis is performed in a fluidized bed reactor.

According to various embodiments, the step of growing carbon nanotubes comprises a step of growth with gaseous acetylene, the gaseous acetylene being mixed with gaseous nitrogen or another inert gas.

According to various embodiments, the step of growing carbon nanotubes is performed at a pressure of between 2 mbar and 15 mbar, in various instances at 13 mbar and at a temperature of between 500° C. and 800° C., in various instances at a temperature of 500° C., 550° C., 600° C., 700° C. or 800° C., for example at a temperature of 600° C.

According to various embodiments, the step of growing nanotubes is performed during a period of between 3 minutes and 60 minutes, in various instances for 20 minutes, 40 minutes or 60 minutes, for example for 40 minutes or 60 minutes, exemplarily for 40 minutes.

According to various embodiments, the mixture between gaseous acetylene and the gaseous nitrogen comprises a portion of gaseous acetylene relative to the gaseous nitrogen that is comprised between 2% and 30%, in various instances that is 10% or 20%, for example that is 20%.

The invention is particularly interesting in that the composite material according to the present invention includes interesting thermal, electric and mechanical properties. The composite materials are indeed more thermally stable and exhibit a high level of conductivity. For the mechanical properties, the increased Young's modulus and the values for stress and break strength parameters of the composite materials according to the invention must be noted. The high specific surface area of diatoms makes for stable attachment to the polymer matrix and to high functionalization (by the CNTs) of this type of mesoporous substrate.

DRAWINGS

FIG. 1 exemplarily illustrates the principle of ALD.

Figure 2:
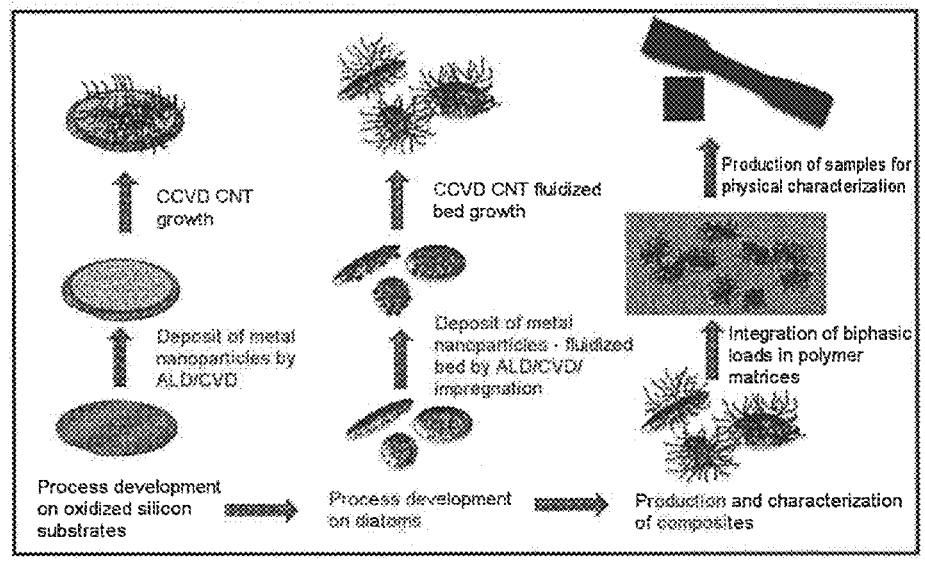

FIG. 2 exemplarily illustrates the production of composites strengthened by a biphasic material (diatoms+CNTs).

Figure 3:
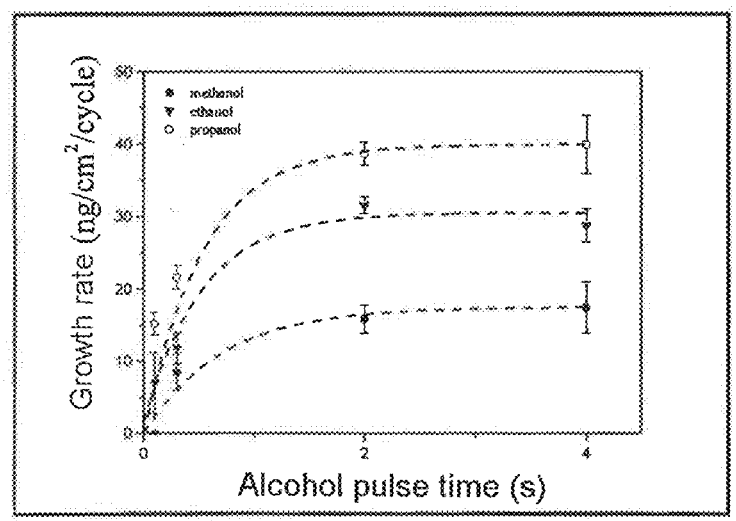

FIG. 3 exemplarily illustrates the rate of growth by cycle as a function of $t_{alcohol}$ and the type of alcohol at 250° C. with $t_{Ni}=t_P=2$ s.

Figure 4:
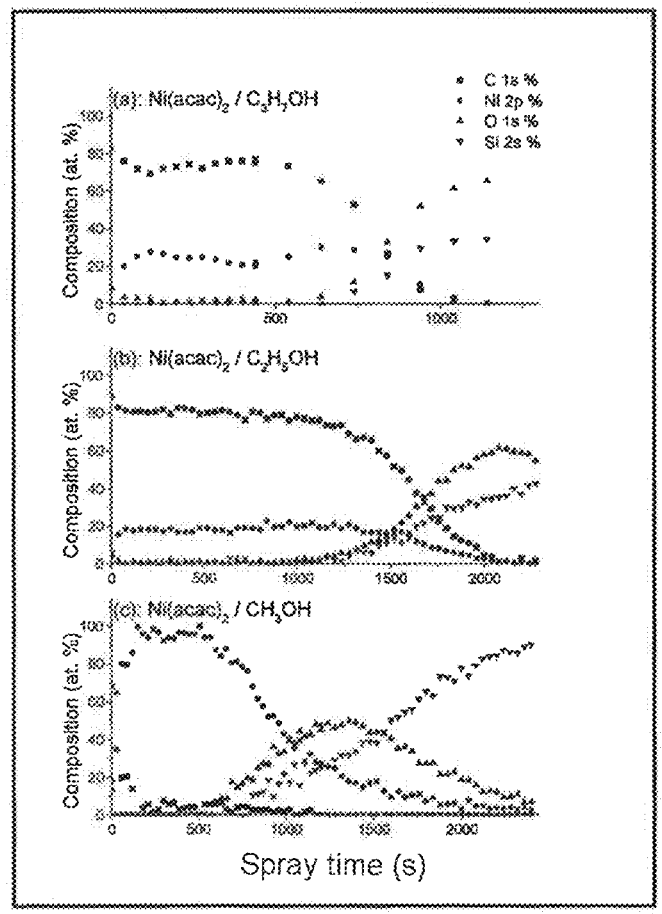

FIG. 4 exemplarily illustrates XPS depth profiles of films deposited by using the $Ni(acac)_2$ and (a) propanol, (b) ethanol and (c) methanol as reducing agents.

Figure 5:
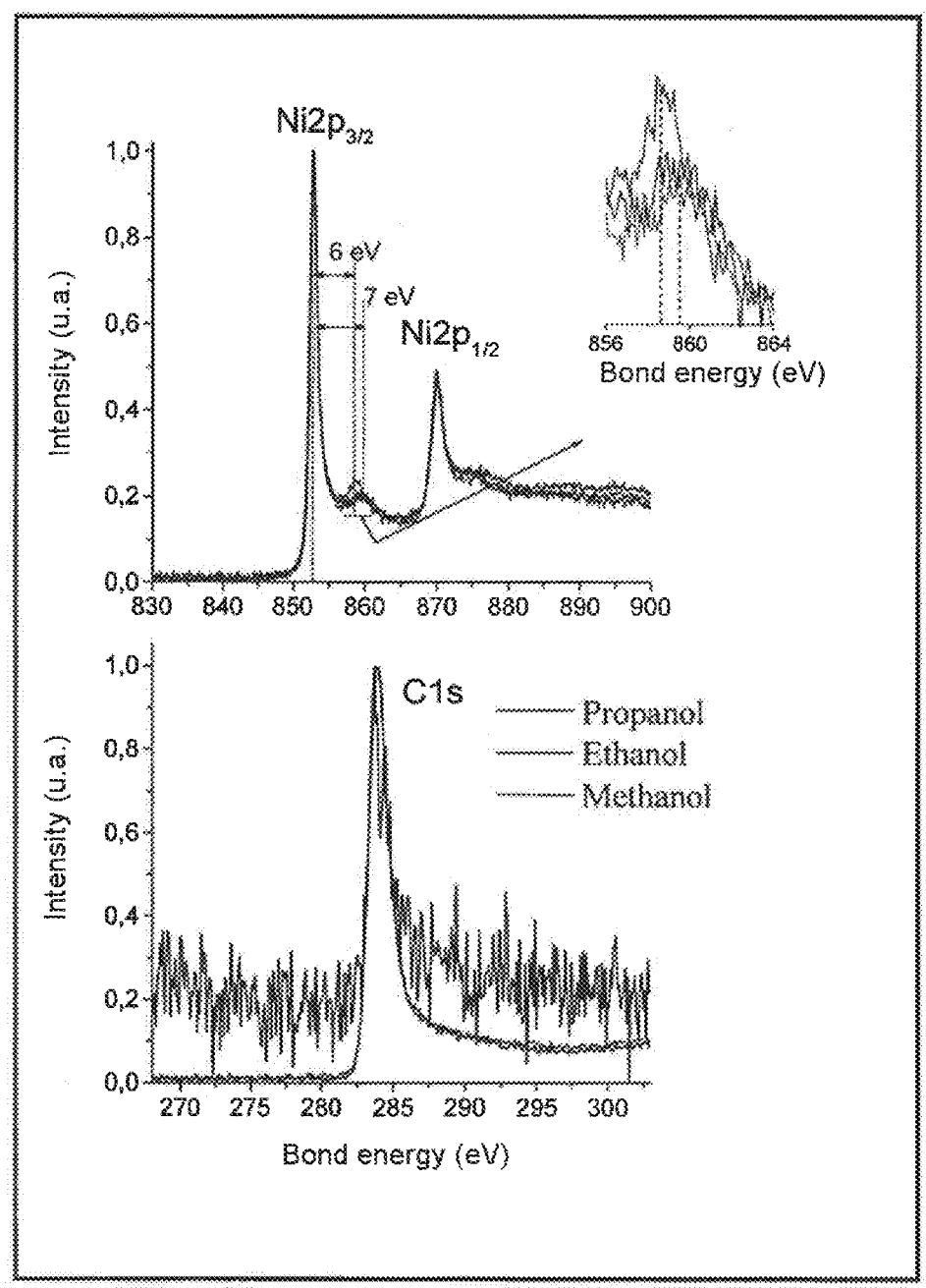

FIG. 5 exemplarily illustrates XPS spectra of the core Ni 2p and C 1s levels of the films deposited using different alcohols as reducing agents at 300° C. and 400 s of stripping time.

Figure 6:
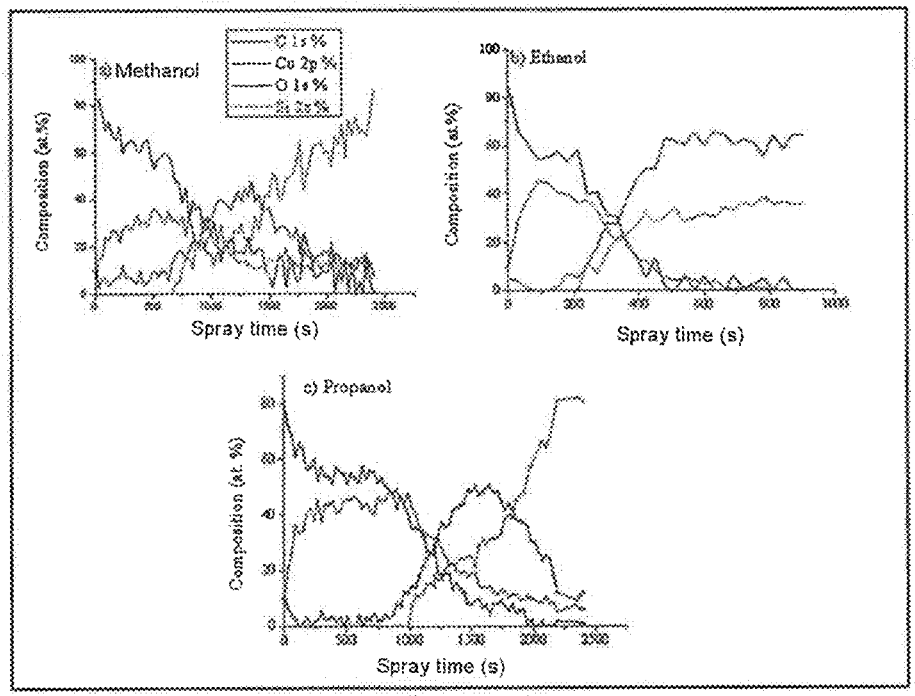

FIG. 6 exemplarily illustrates XPS depth profiles of films deposited at 350° C. using $Co(acac)_2$ reduced by the three alcohols, the $Co(acac)_2$ pulse time is 3 s, the purge time is 2s, the pulse time for alcohols is 4 s and 4000 cycles.

Figure 7:
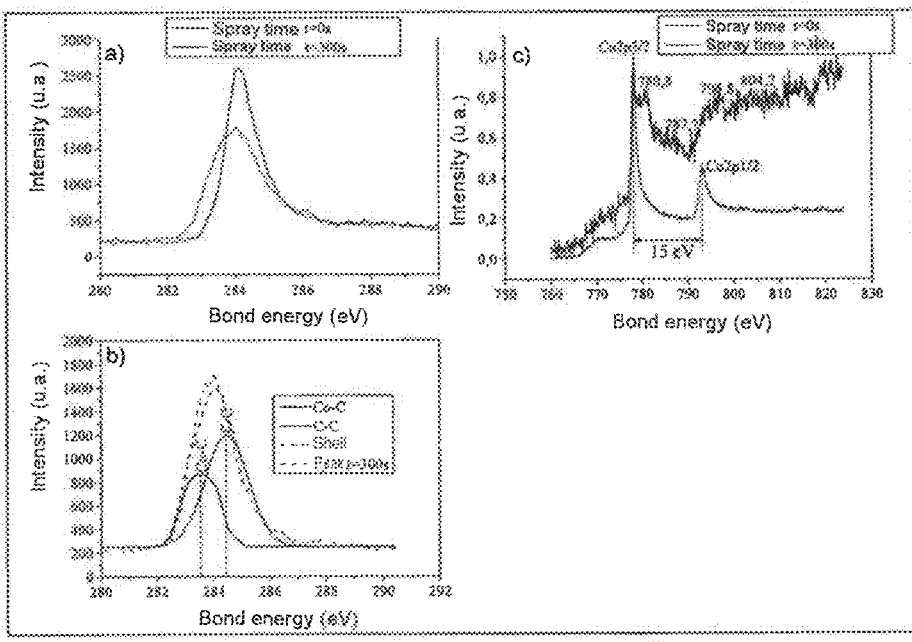

FIG. 7 exemplarily illustrates XPS spectra of core levels a) at the surface and at 300 s of spraying C 1s with argon, b) of C 1s and its deconvolution by a Gaussian-Lorentzian function, c) of Co 2p at the surface and at 300 s of spraying the films deposited at 350° C. reduced by propanol with argon.

Figure 8:
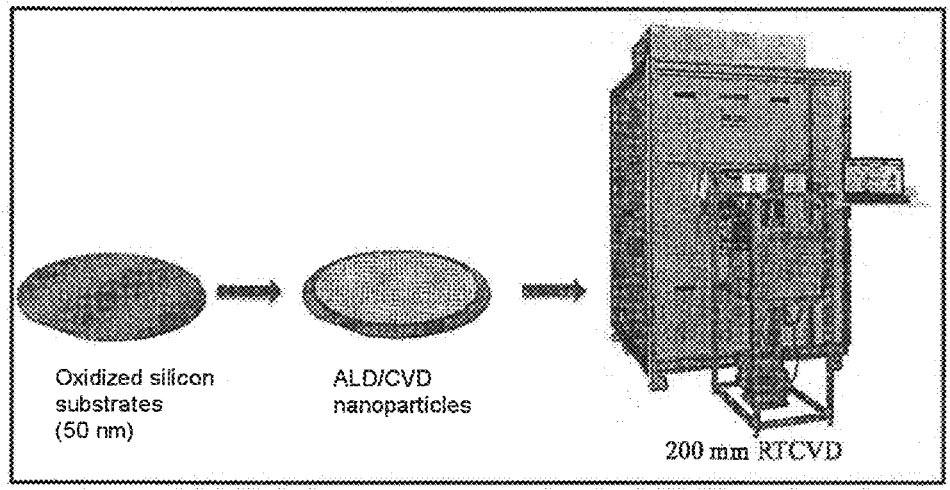

FIG. 8 exemplarily illustrates the nanotube growth procedure on flat substrate.

Figure 9:
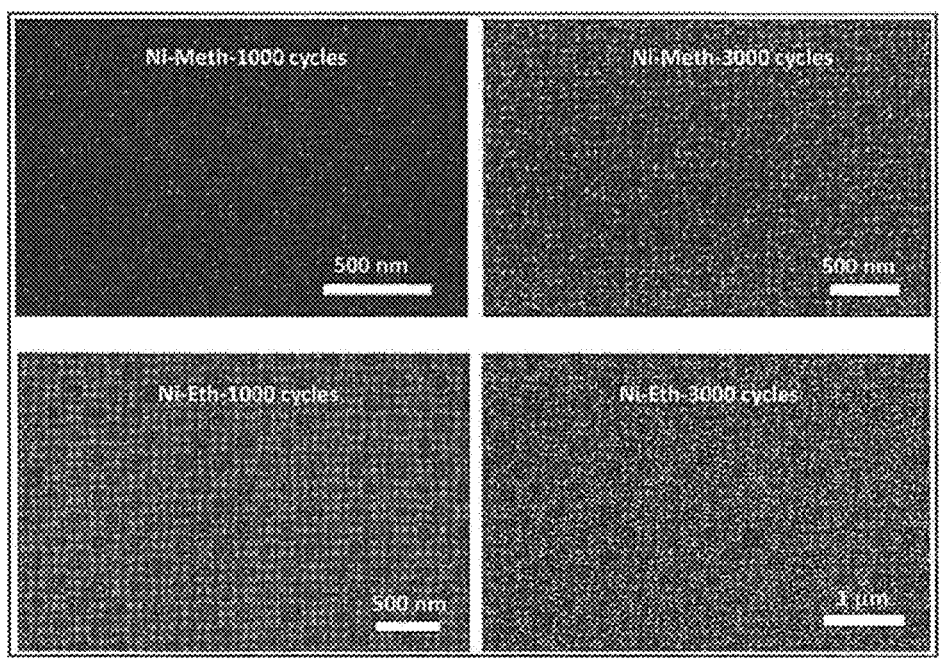

FIG. 9 exemplarily illustrates SEM images of the morphology of different substrates used for the growth of carbon nanotubes.

Figure 10:
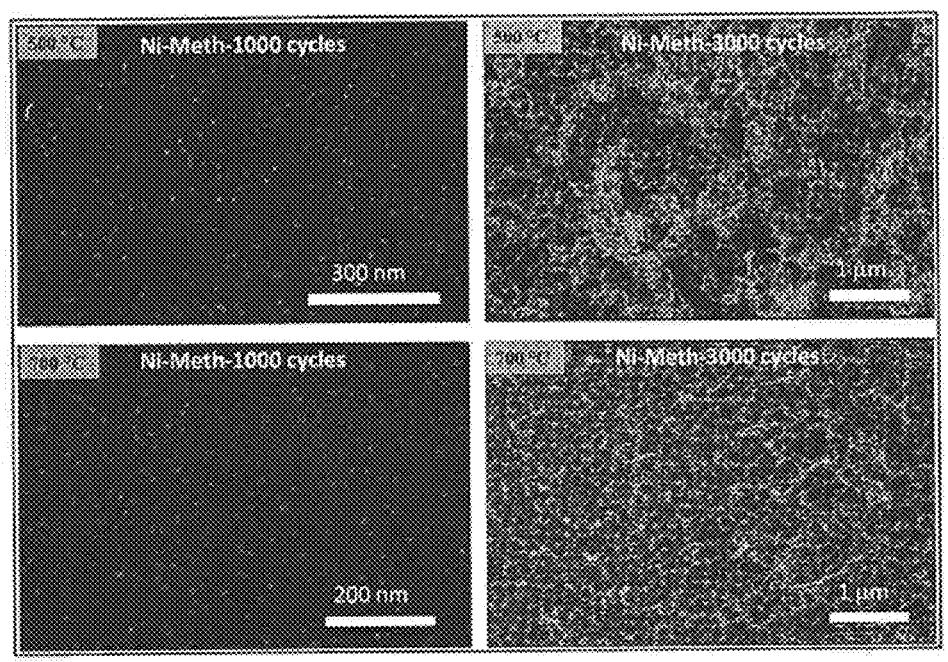

FIG. 10 exemplarily illustrates SEM images of carbon structures synthesized at 500° C. and 700° C. on catalysts made by ALD of $Ni(acac)_2$ and methanol at 300° C., 1000 cycles and 3000 cycles.

Figure 11:
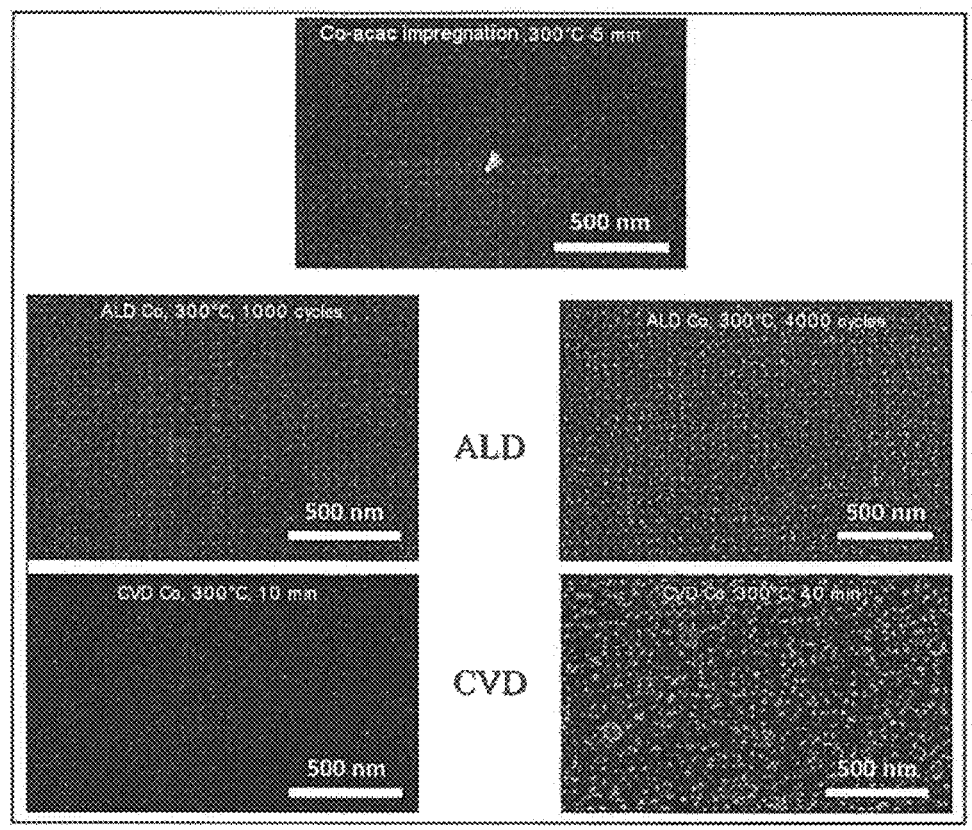

FIG. 11 exemplarily illustrates SEM images of the morphology of films deposited under different conditions used for the growth of carbon nanotubes.

Figure 12:
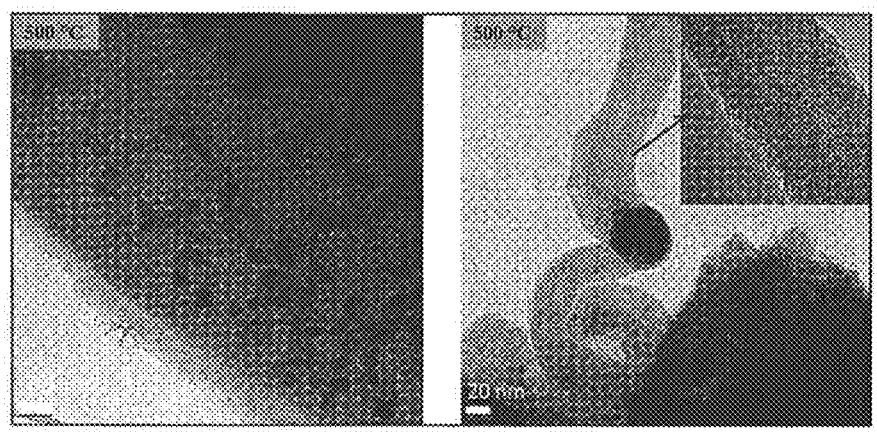

FIG. 12 exemplarily illustrates TEM images of the sample synthesized at 500° C. on catalysts made by CVD.

Figure 13:
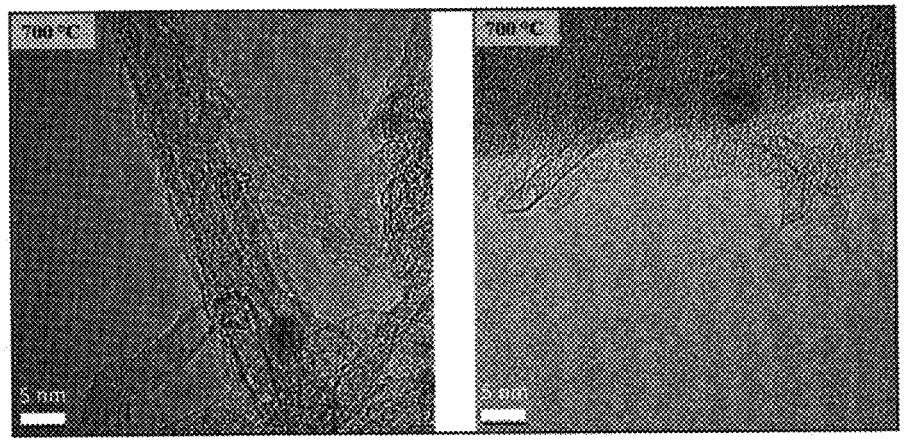

FIG. 13 exemplarily illustrates TEM images of the sample synthesized at 700° C. on catalysts made by CVD.

Figure 14:
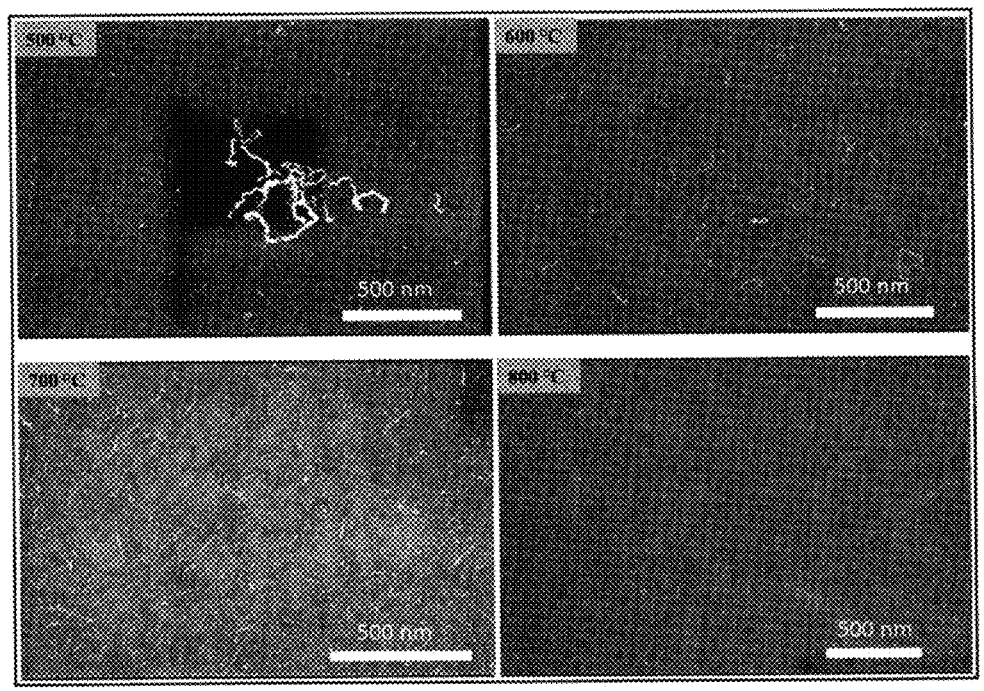

FIG. 14 exemplarily illustrates SEM images of carbon nanotubes synthesized at different temperatures after vapour impregnation.

Figure 15:
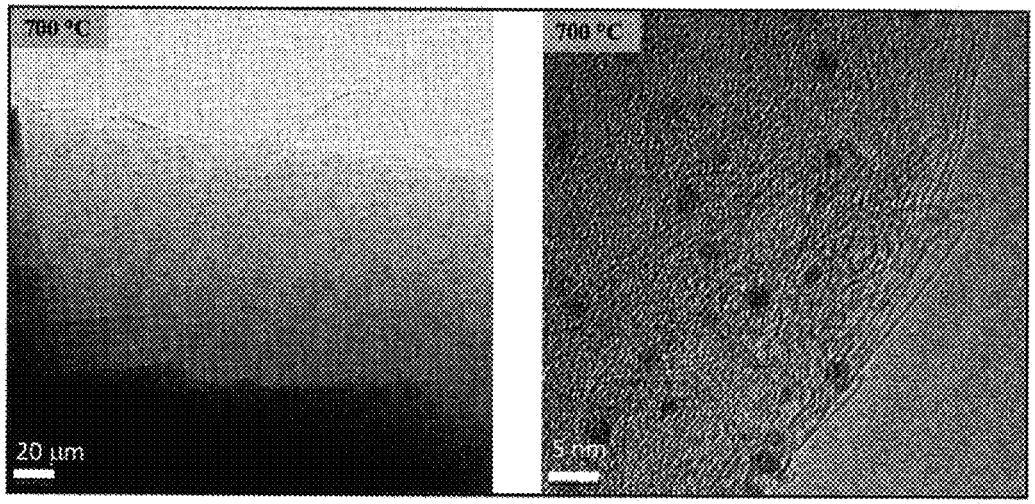

FIG. 15 exemplarily illustrates TEM images of the sample synthesized at 700° C. on catalysts made by impregnation.

Figure 16:
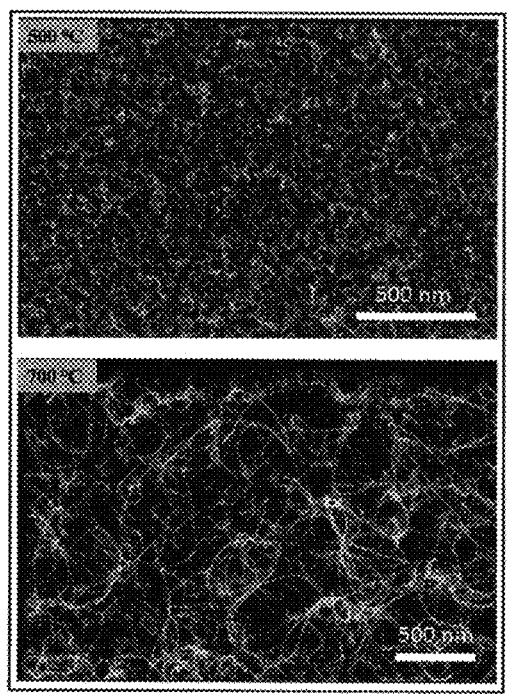

FIG. 16 exemplarily illustrates SEM images of carbon structures synthesized at 500° C. and 700° C. on catalysts made by ALD.

Figure 17:
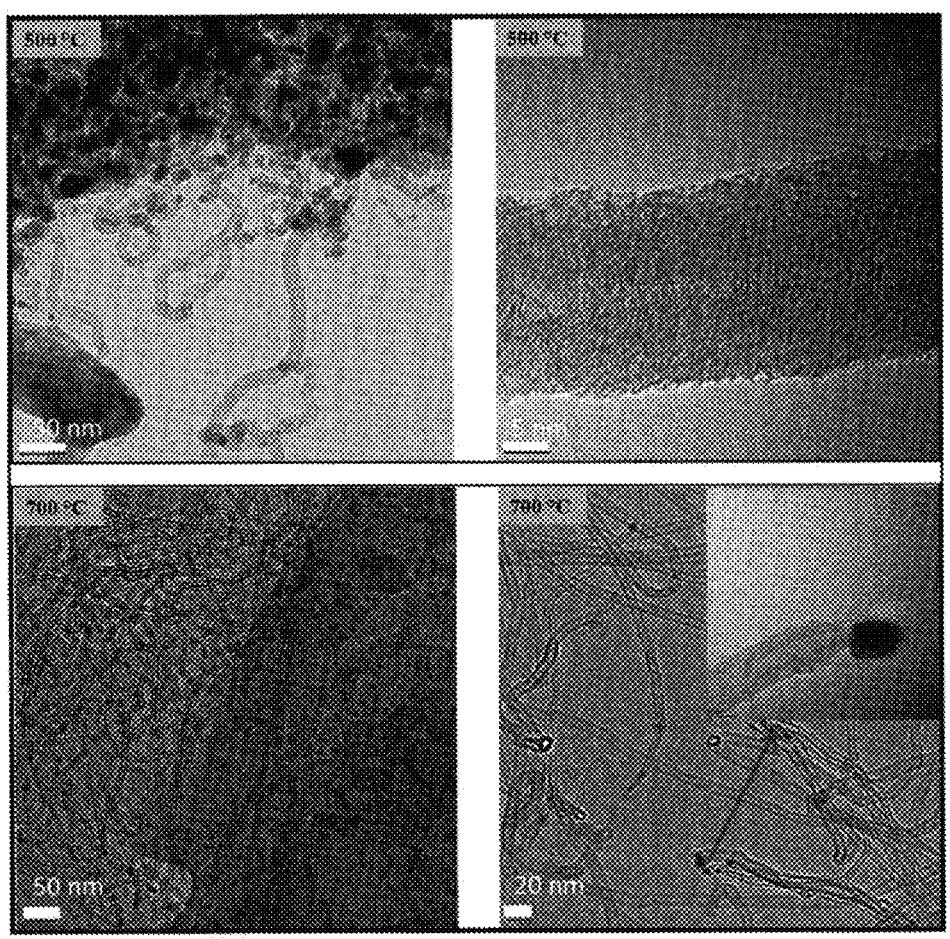

FIG. 17 exemplarily illustrates TEM images of the carbon structures synthesized at 500° C. and 700° C. on catalysts made by ALD.

Figure 18:
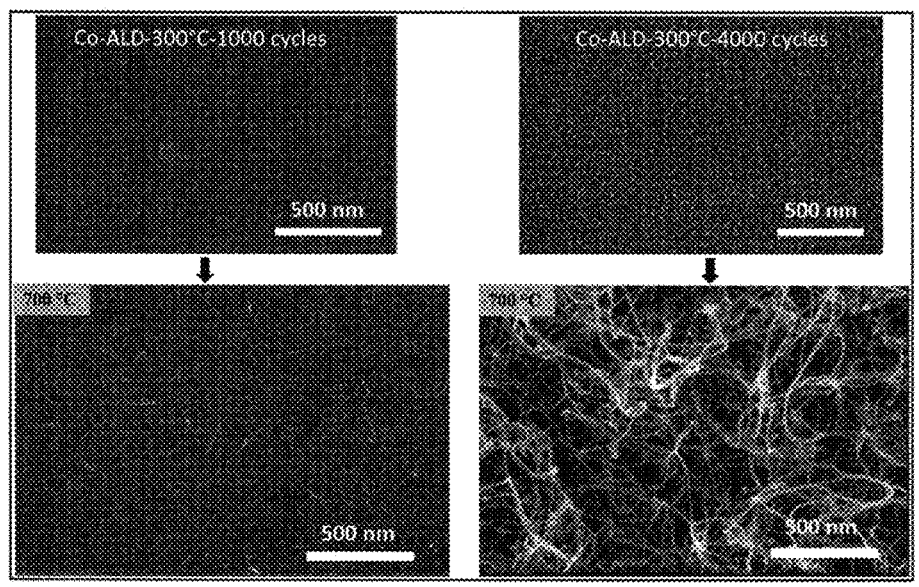

FIG. 18 exemplarily illustrates SEM images of carbon nanotubes synthesized on samples made by ALD Co, 300° C., 1000 cycles and 4000 cycles.

Figure 19:
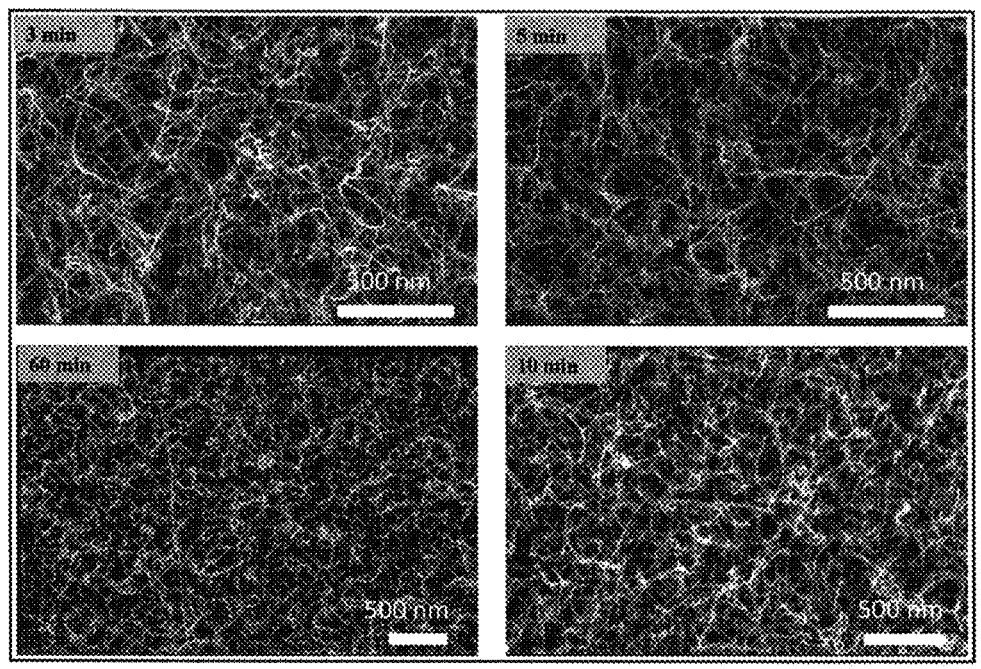

FIG. 19 exemplarily illustrates SEM images of carbon nanotubes synthesized at different growth times.

Figure 20:
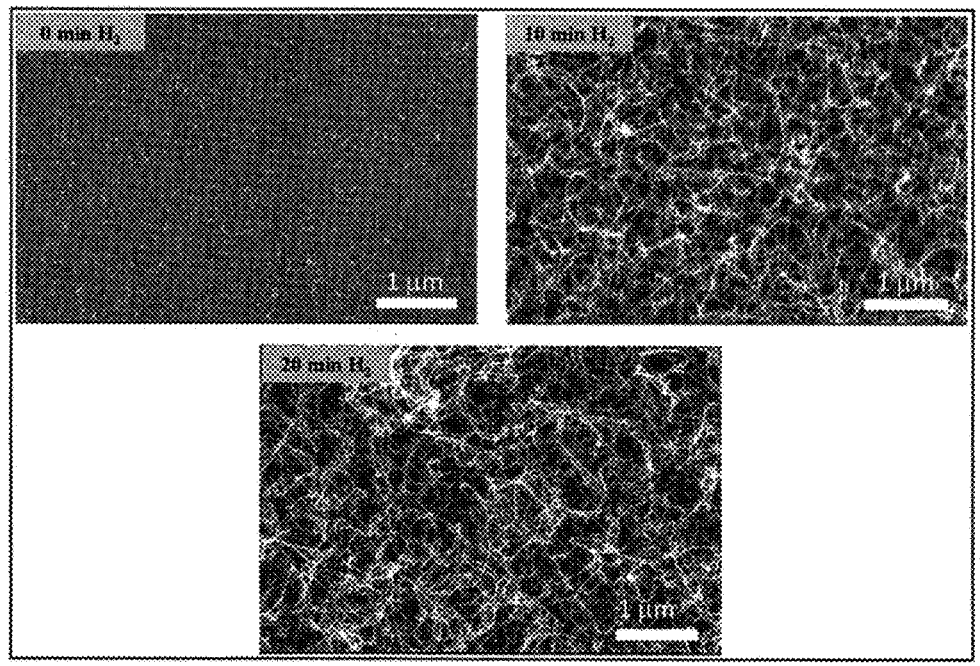

FIG. 20 exemplarily illustrates SEM images of carbon nanotubes synthesized at different reduction times.

Figure 21:
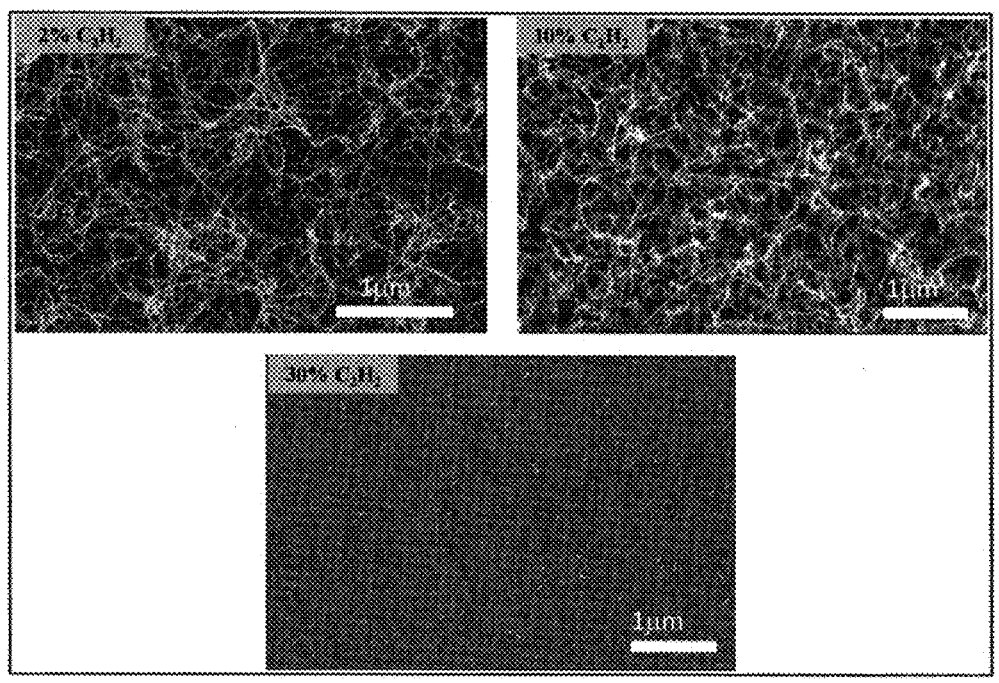

FIG. 21 exemplarily illustrates SEM images of carbon nanotubes synthesized at different acetylene concentrations.

Figure 22:
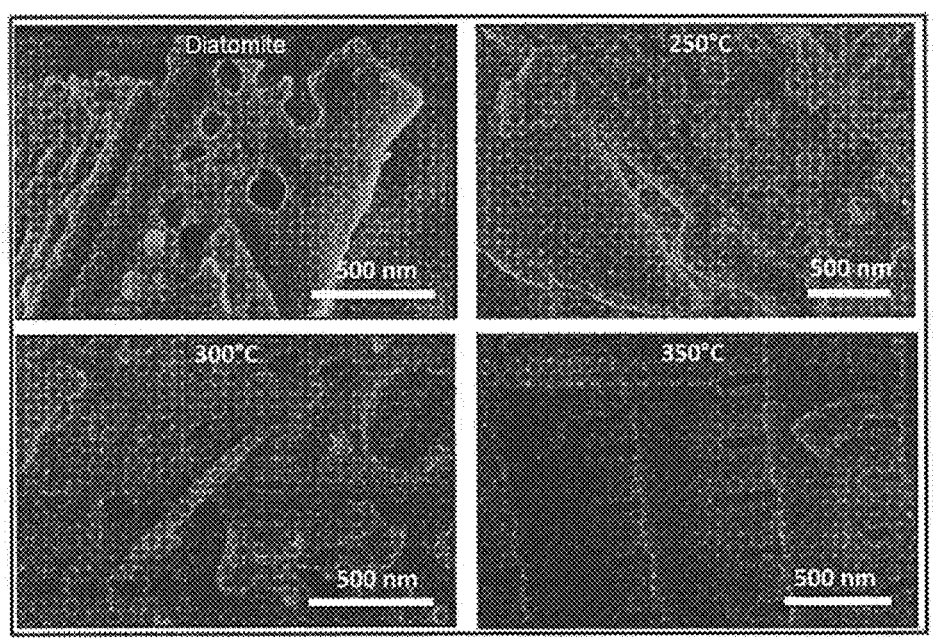

FIG. 22 exemplarily illustrates SEM images of the morphology of cobalt carbide nanoparticle deposits as a function of the temperature of the ALD process.

Figure 23:
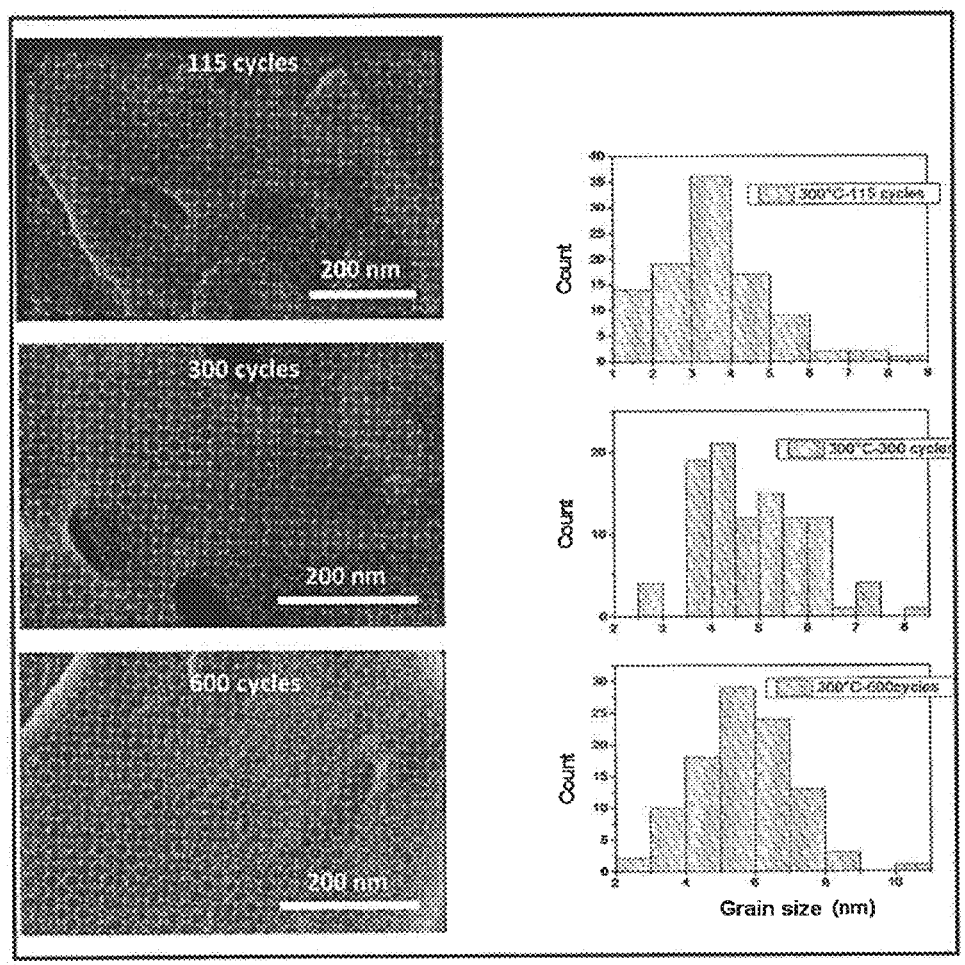

FIG. 23 exemplarily illustrates the morphology of deposits and cobalt particle size distribution as a function of the number of cycles of ALD deposit.

Figure 24:
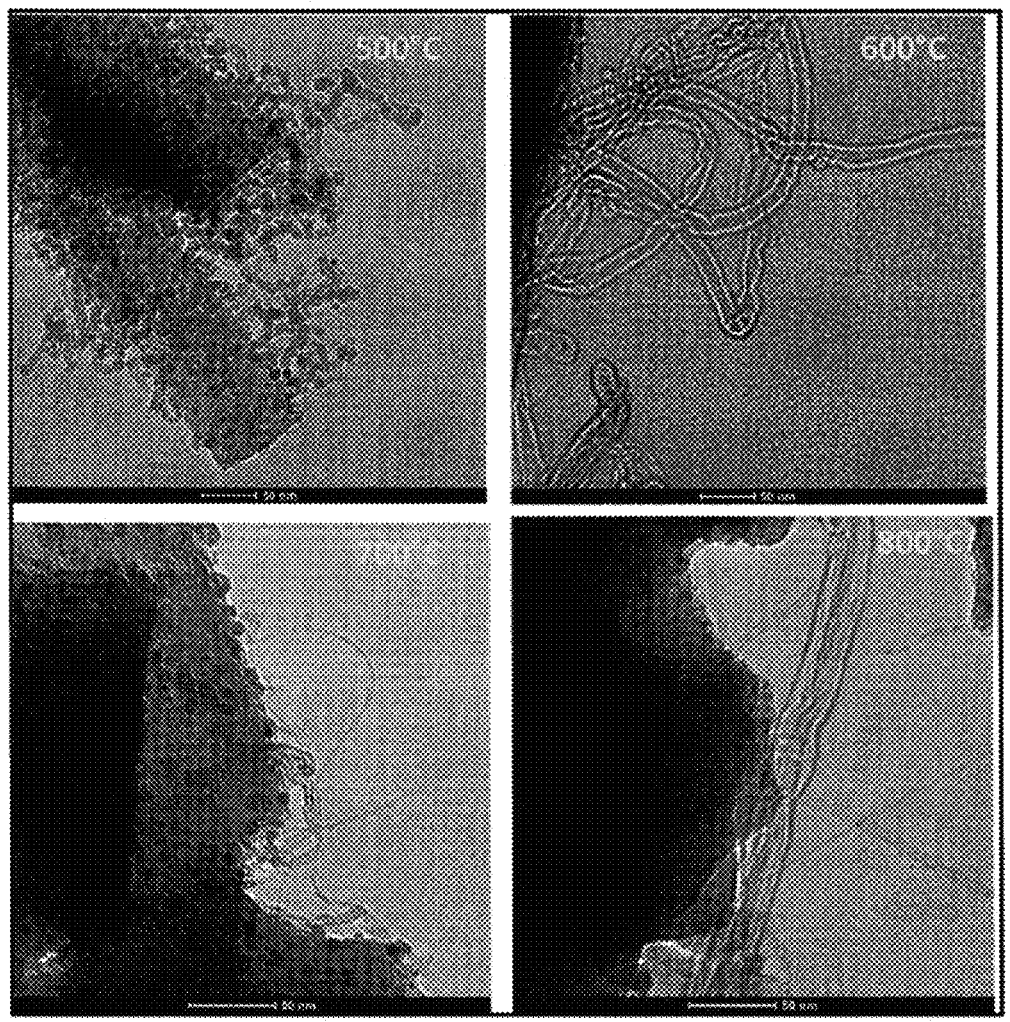

FIG. 24 exemplarily illustrates TEM images of nanotubes on diatoms synthesized at different temperatures.

Figure 25:
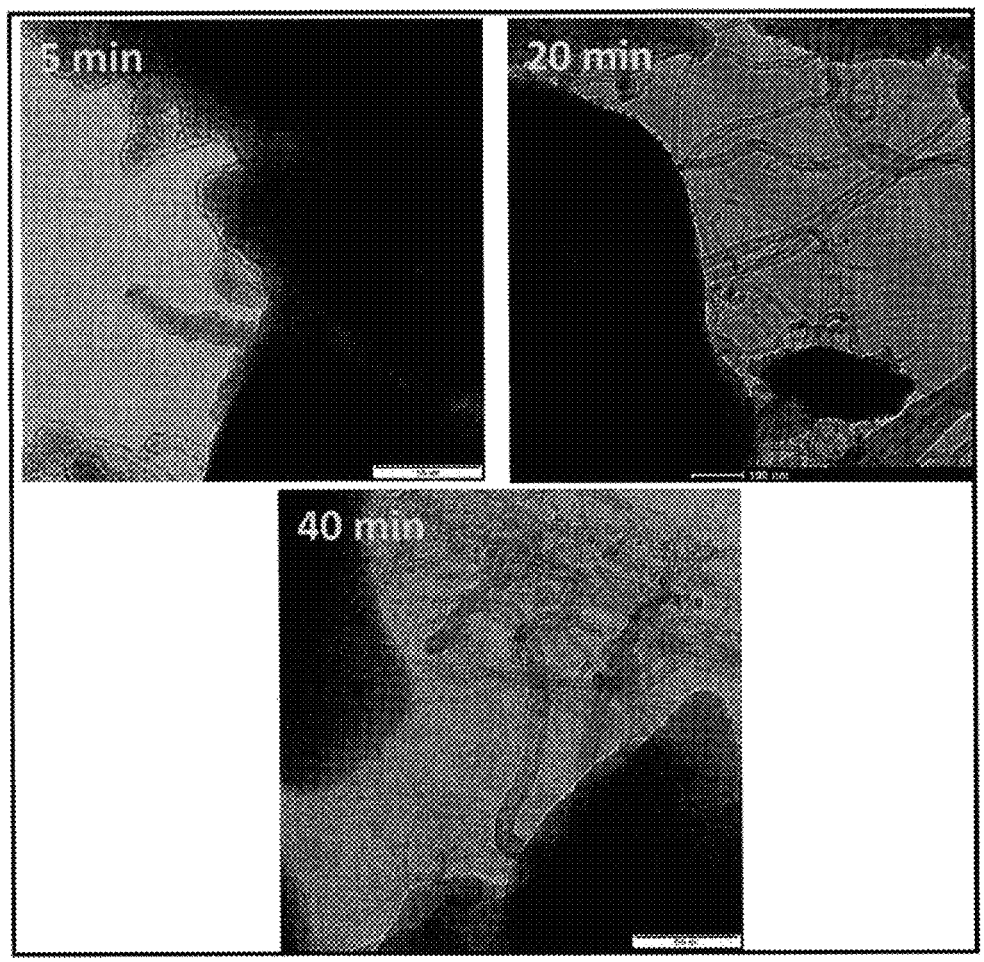

FIG. 25 exemplarily illustrates TEM images of nanotubes on diatoms synthesized at different growth times.

Figure 26:
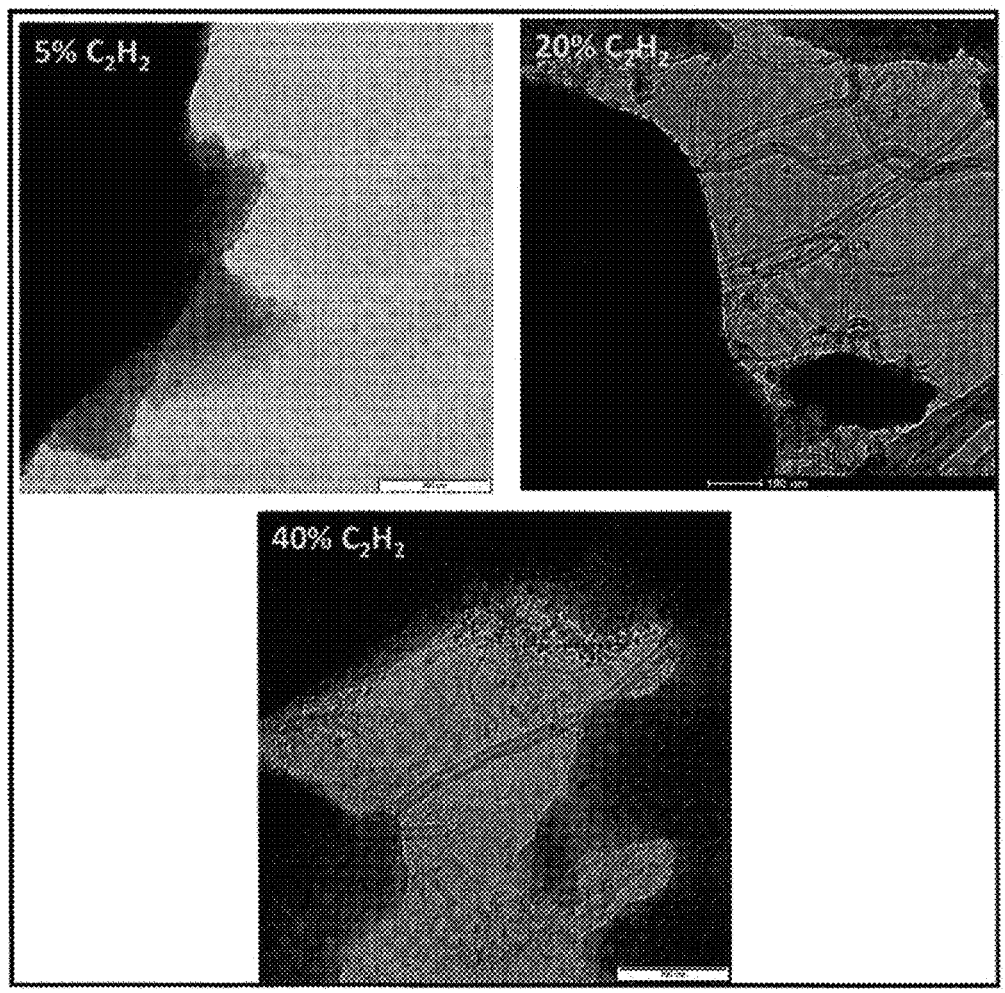

FIG. 26 exemplarily illustrates TEM images of nanotubes on diatoms synthesized at different acetylene concentrations.

Figure 27:
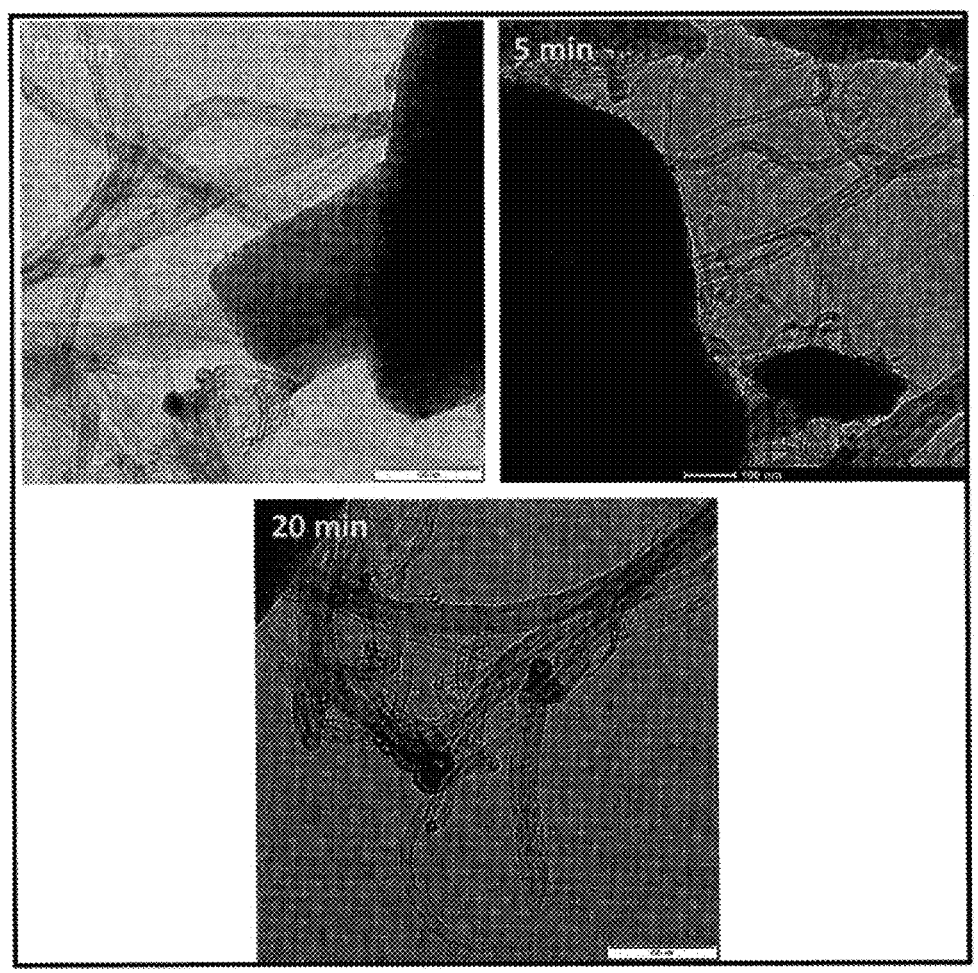

FIG. 27 exemplarily illustrates TEM images of nanotubes on diatoms synthesized at different reduction times.

Figure 28:
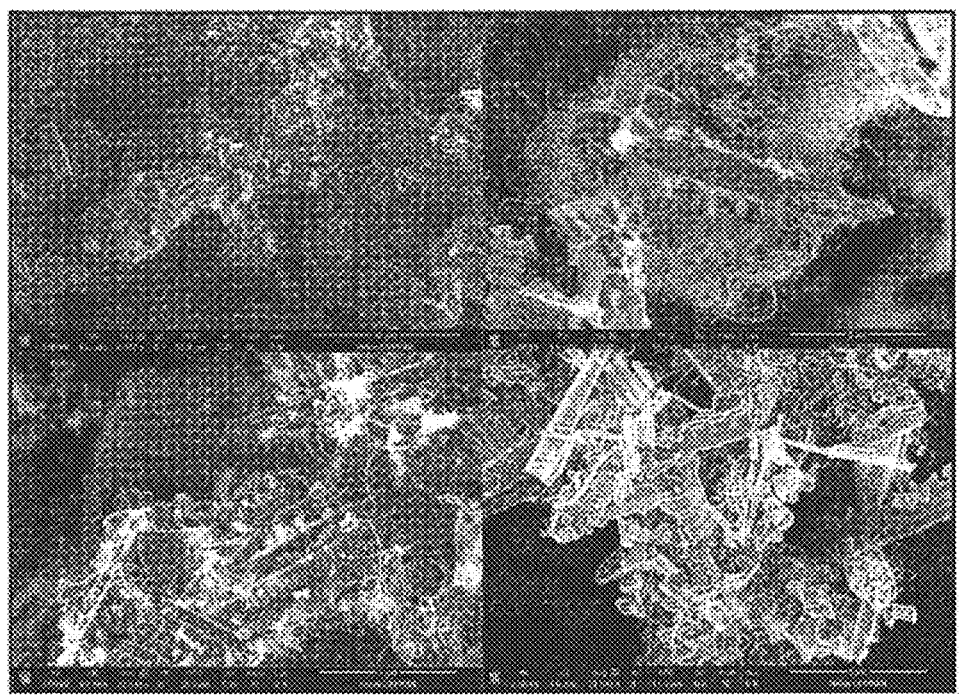

FIG. 28 exemplarily illustrates SEM images of nanotubes on diatoms synthesized at 600° C., 45 minutes, 20% acetylene concentration and 20 minutes reduction with hydrogen.

Figure 29:
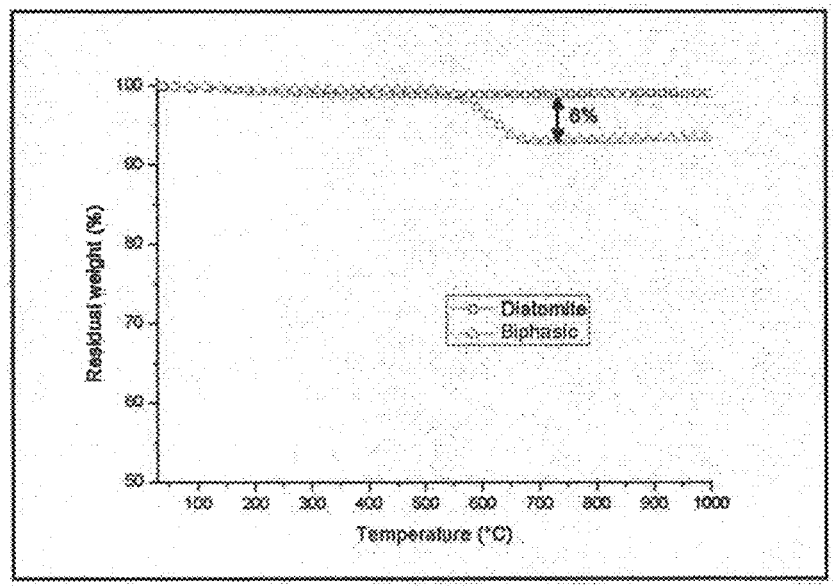

FIG. 29 exemplarily illustrates thermogravimetric analysis under air of nanotubes on diatoms synthesized at 600° C., 45 minutes, 20% acetylene concentration and 20 minutes reduction.

Figure 30:
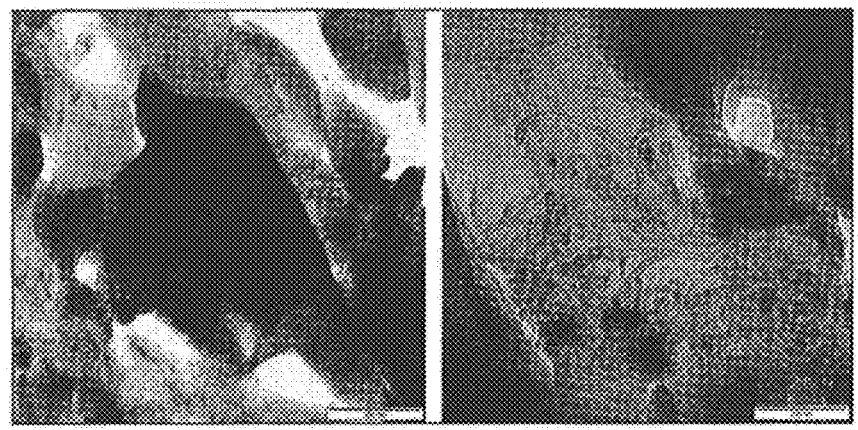

FIG. 30 exemplarily illustrates TEM images of composite based on PMMA and biphasic materials (10%) mixed at 10 rpm.

Figure 31:
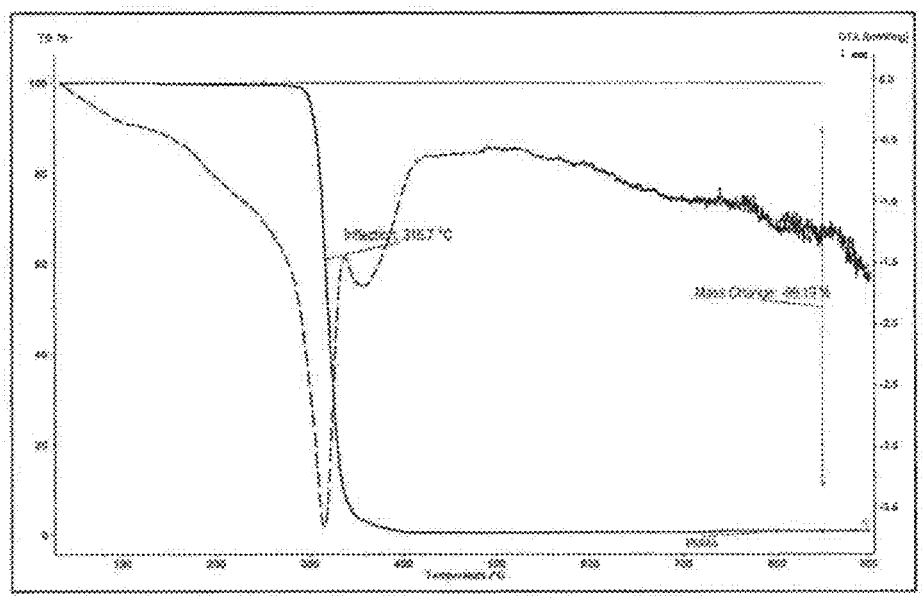

FIG. 31 exemplarily illustrates thermal degradation of PMMA.

Figure 32:
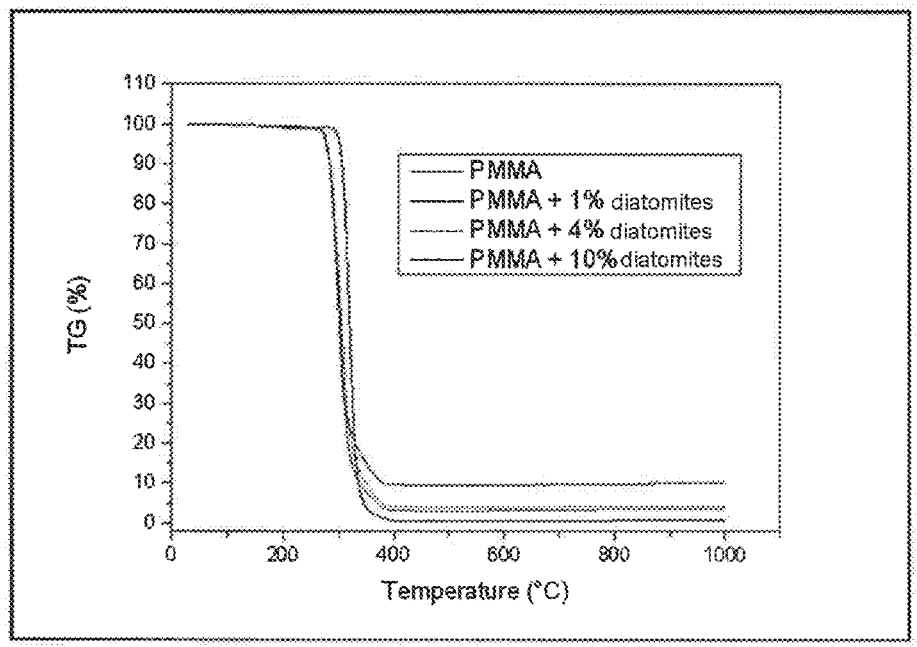

FIG. 32 exemplarily illustrates thermal degradation of PMMA and PMMA strengthened by diatoms with increasing mass load, all mixed at 10 rpm.

Figure 33:
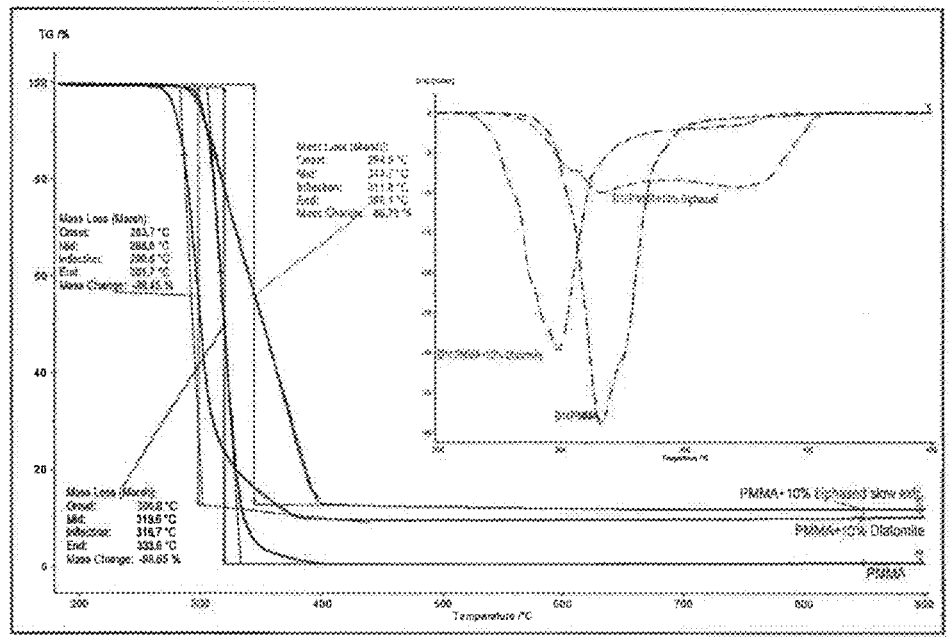

FIG. 33 exemplarily illustrates thermal degradation of PMMA and PMMA strengthened by 10% diatoms alone or by 10% of biphasic loads (diatoms+carbon nanotubes).

Figure 34:
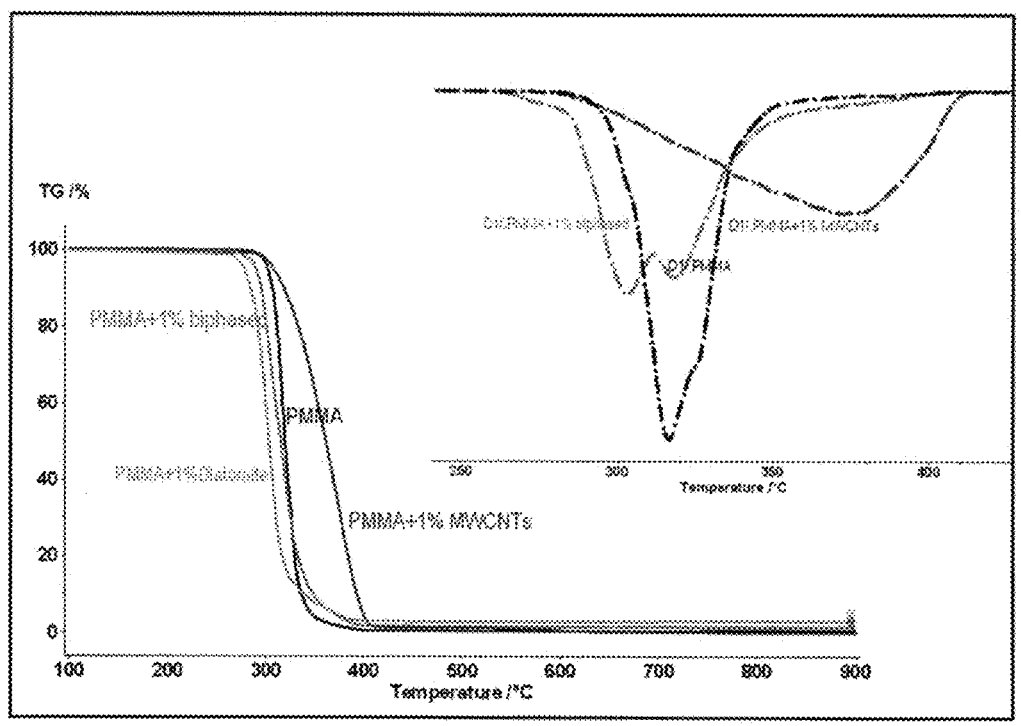

FIG. 34 exemplarily illustrates thermal degradation of PMMA and PMMA strengthened by diatoms, biphasic loads and 1% commercial MWCNT, all mixed at 10 rpm.

Figure 35:
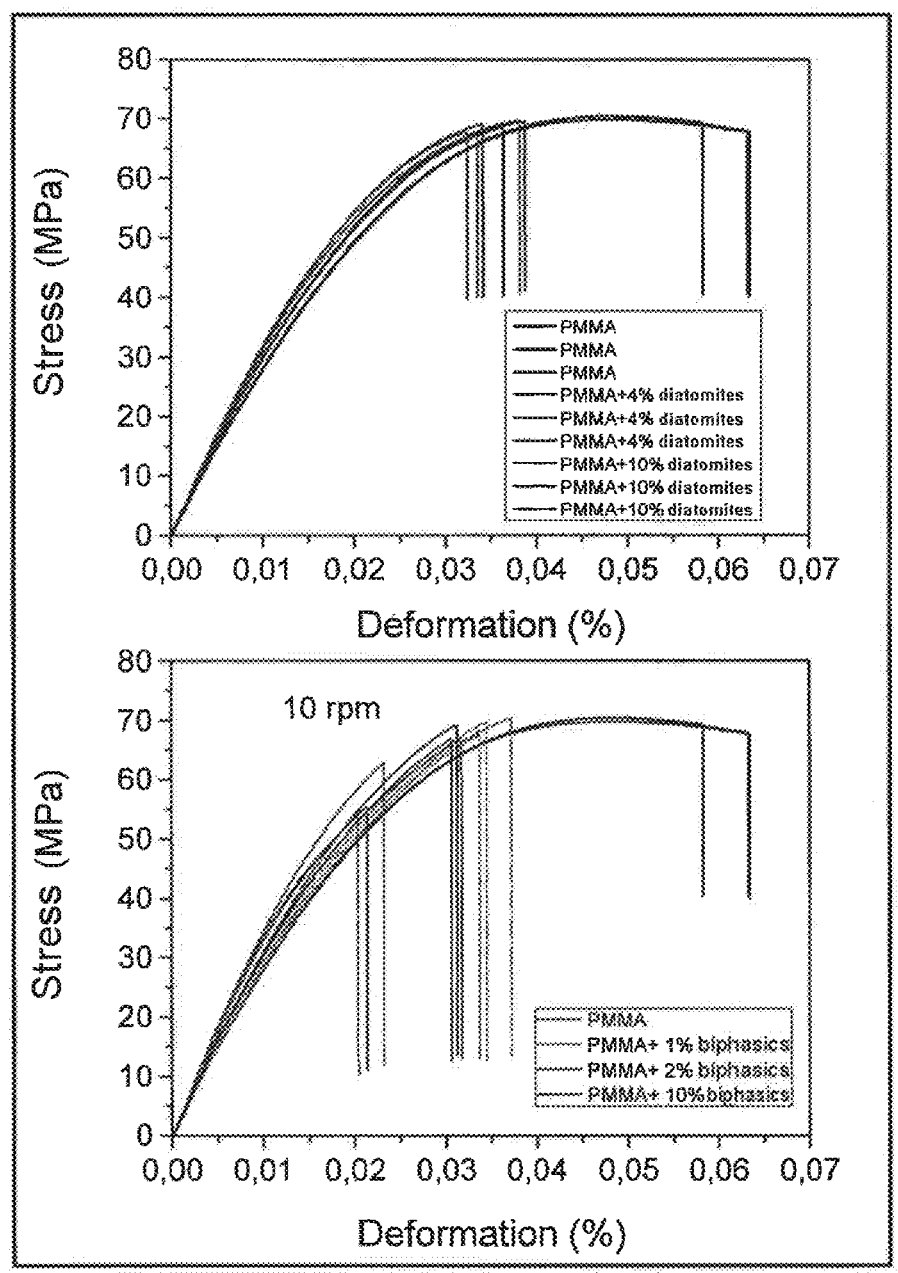

FIG. 35 exemplarily illustrates the stress-strain curve for PMMA and PMMA loaded at 4 and 10% of diatoms alone and 1, 4 and 10% of biphasics (diatoms+carbon nanotubes).

Figure 36:
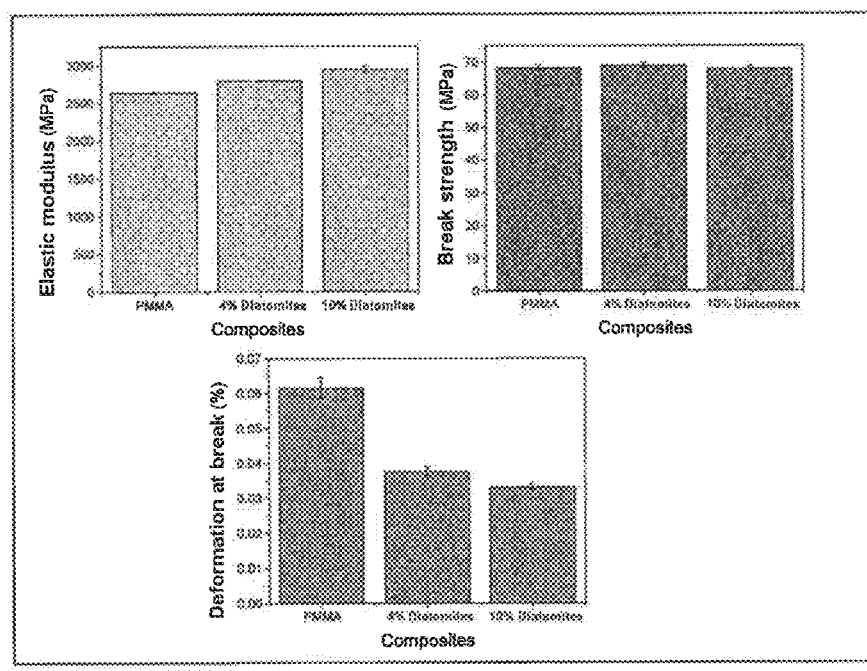

FIG. 36 exemplarily illustrates the comparison of mechanical properties of PMMA and PMMA strengthened by 4 and 10% of diatoms alone.

Figure 37:
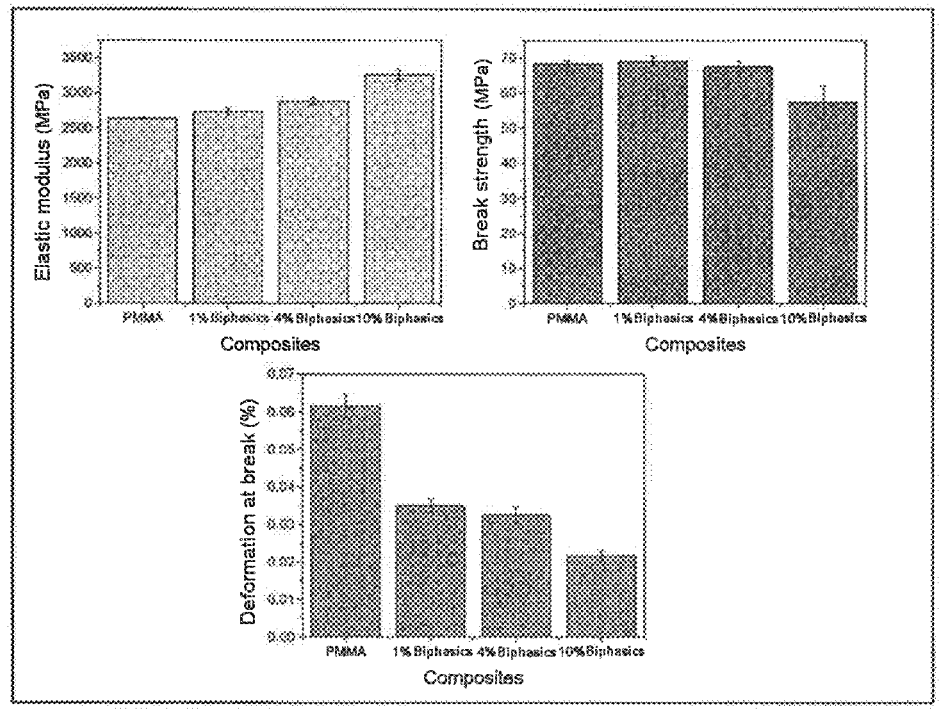

FIG. 37 exemplarily illustrates the comparison of mechanical properties of PMMA and PMMA strengthened by 1, 4 and 10% of biphasics (diatoms+carbon nanotubes).

Figure 38:
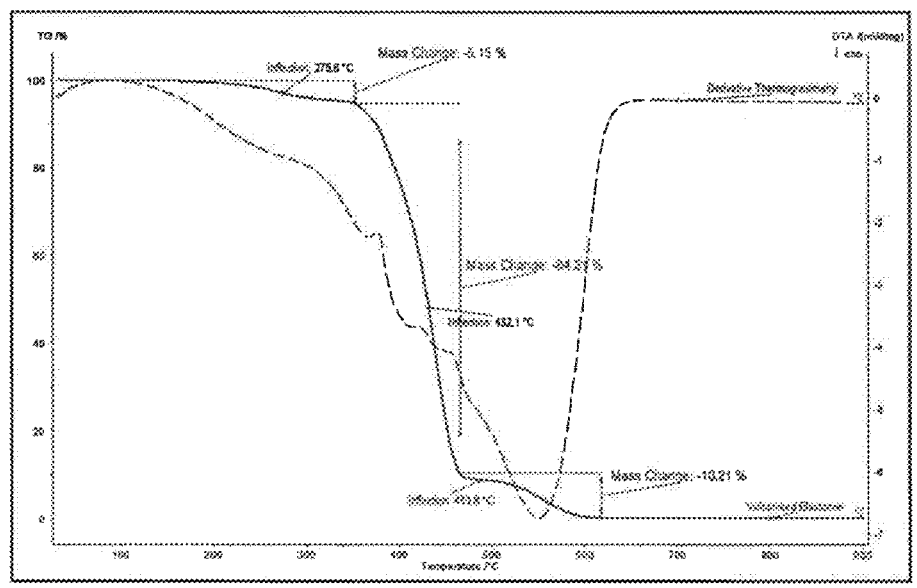

FIG. 38 exemplarily illustrates thermal degradation of SBR.

Figure 39:
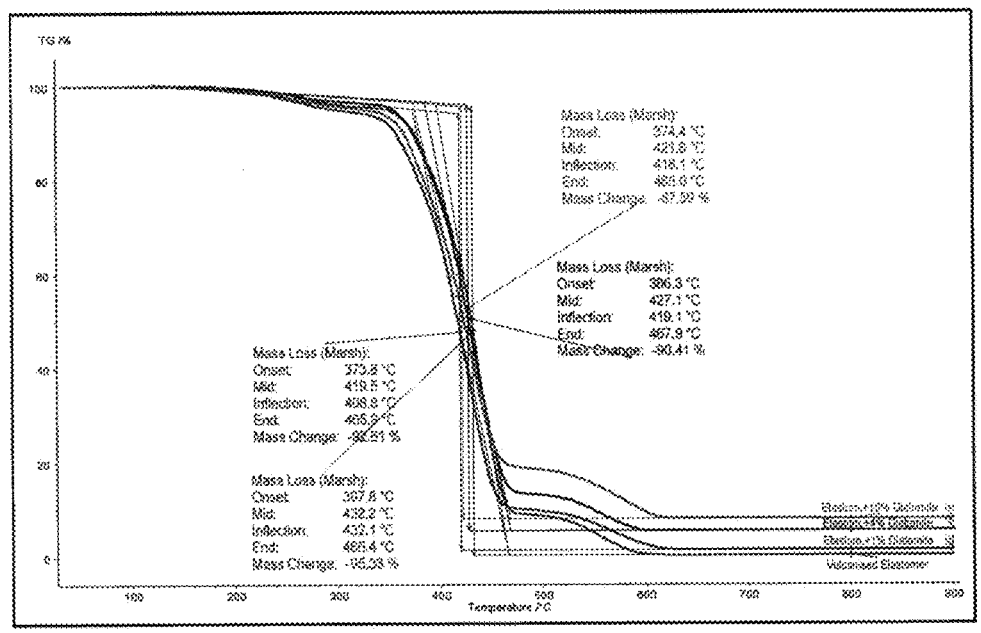

FIG. 39 exemplarily illustrates thermal degradation of SBR and SBR loaded with diatoms.

Figure 40:
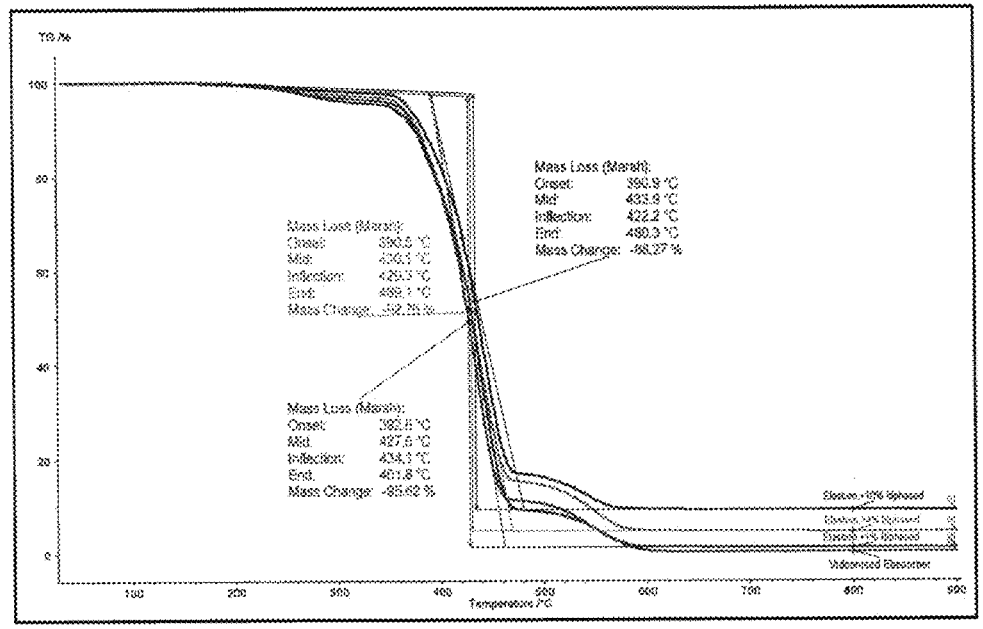

FIG. 40 exemplarily illustrates thermal degradation of SBR and SBR mixed with biphasic loads (diatoms+carbon nanotubes).

Figure 41:
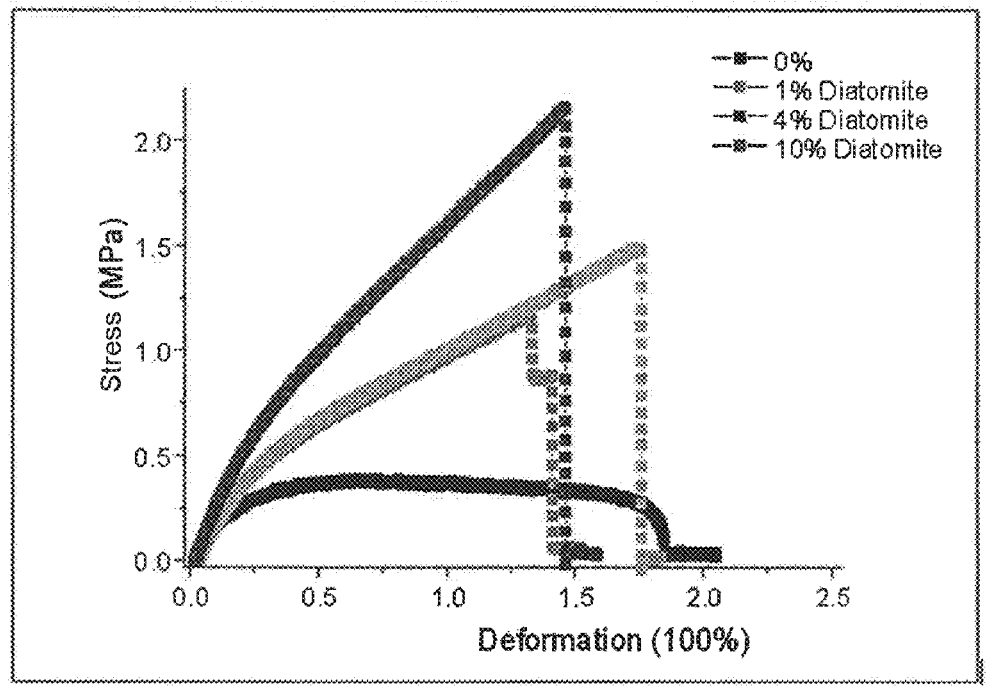

FIG. 41 exemplarily illustrates the stress-strain curve for SBR and SBR loaded at 1, 4 and 10% diatoms.

Figure 42:
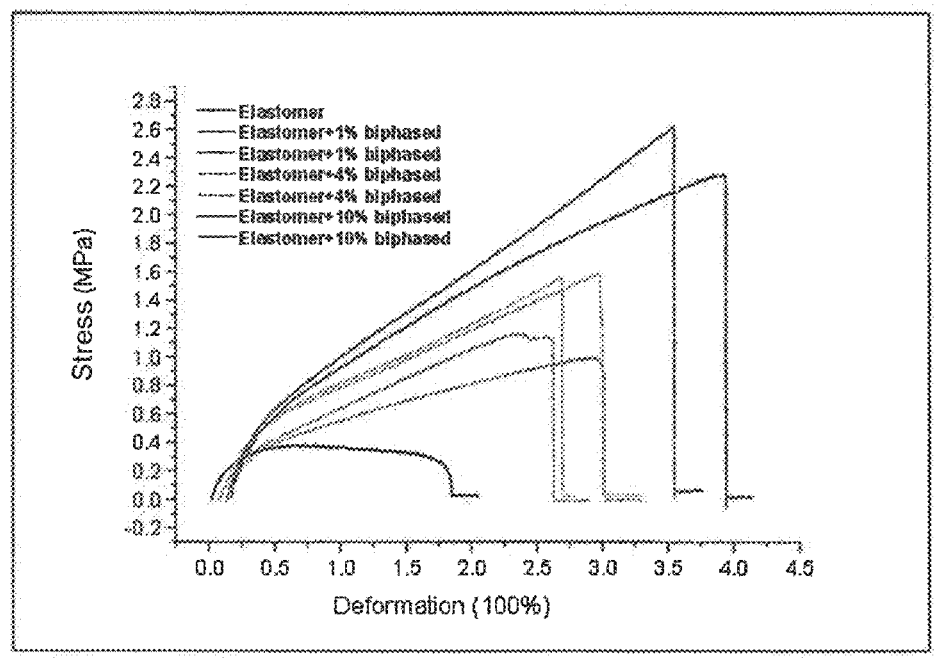

FIG. 42 exemplarily illustrates the stress-strain curve for SBR and SBR loaded at 1, 4 and 10% of biphasics (diatoms+carbon nanotubes).

Figure 43:
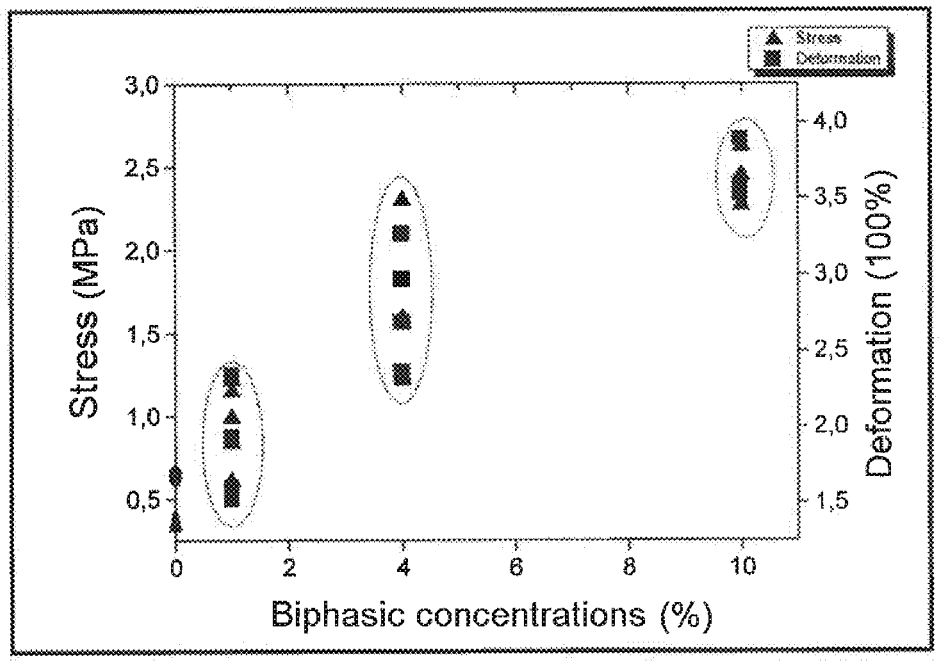

FIG. 43 exemplarily illustrates the break strength and elongation for different concentrations of biphasics.

Figure 44:
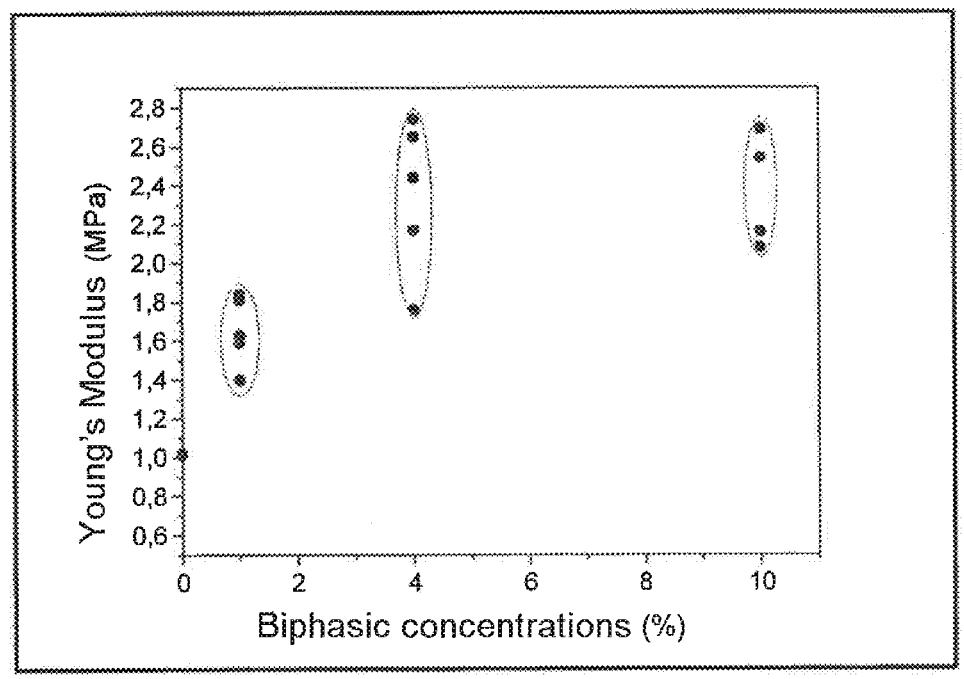

FIG. 44 exemplarily illustrates Young's Modulus for different concentrations of biphasics.

Figure 45:
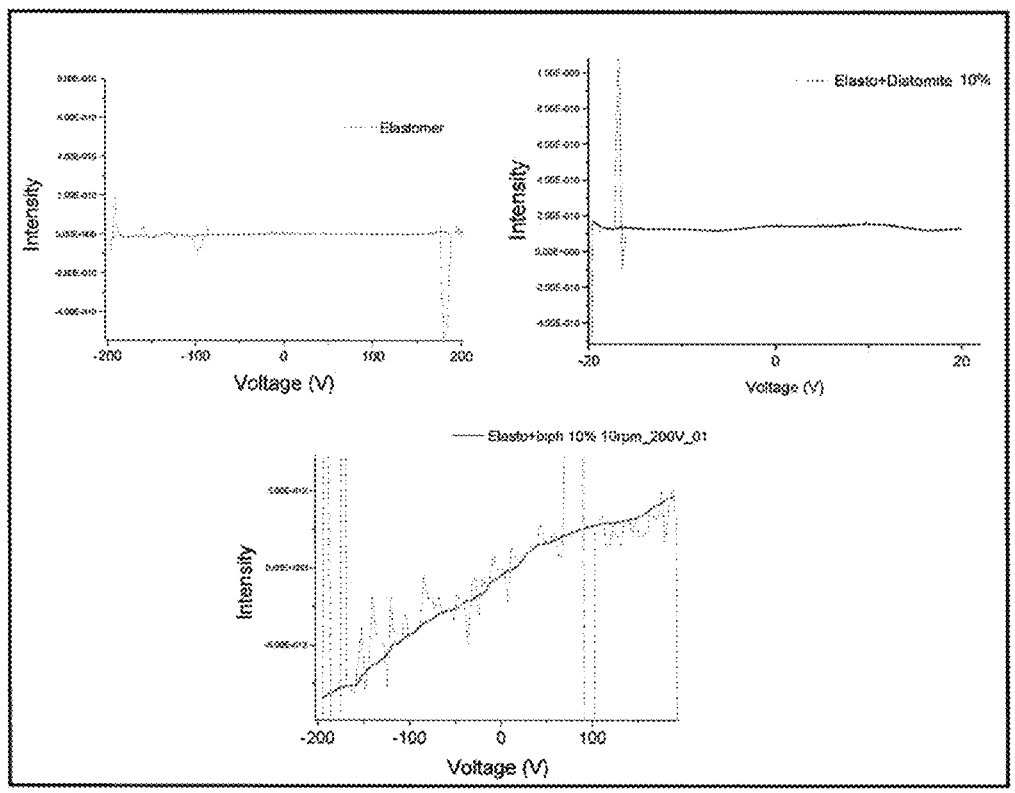

FIG. 45 exemplarily illustrates the electric measurements on SBR, SBR+10% diatoms alone, SBR+10% biphasic loads (diatoms+carbon nanotubes).

DETAILED DESCRIPTION

As indicated in FIG. 2, first the growth process of CNTs on silicon oxide substrates was developed. This process comprises the deposit of Ni and Co nanoparticles by ALD/CVD/impregnation followed by growth of nanotubes by CCVD. This process is then transferred on diatoms (3D substrate) through a fluidized bed. The biphasic material synthesized in polymer matrices will be integrated using an extruder. The samples for physical characterizations will be made using injection moulding and a hydraulic press.

The growth of carbon nanotubes requires a relevant choice of catalysts and their preparation techniques. The choice of catalyst type is constrained by the target application. Ni and Co were selected because in principle they have no negative impact on tire ageing by contrast with Fe. The diatoms that are used as a mesoporous substrate for diverse complex shapes (powders), so not all deposit techniques allow deposition of nanoparticles on their surface. For this the deposit atomic layer deposition technique (ALD was chosen): it is the most adequate for depositing materials on complex substrates. Vapour impregnation was also attempted.

Methanol, ethanol and propanol for the reduction of metal-organic precursors such as nickel acetylacetonate and cobalt acetylacetonate in the ALD processes are used. This is the first time that alcohols have been used in ALD as reducing agents to deposit layers of Ni and Co (and their derivatives such as carbides). For the ALD deposits a Beneq TFS200 device was the machine used.

Deposit on Flat Substrates.

Substrates.

Flat substrates are constituted of a silicon wafer coated with a 50 nm layer of silicon oxide. This oxide layer models the surface of diatoms well and avoids the formation of alloys such as silicides between the silicon and transition metals such as Ni and Co. This layer acts as a barrier to the diffusion of these metals in the silicon. It grows by RTCVD (Rapid Thermal Chemical Vapour Deposition) at 1000° C. on a silicon substrate oriented in the plane (100).

Cleaning.

The samples (oxidized silicon) are first soaked in acetone with sonication for 10 minutes followed by rinsing with deionized water. The samples are then plunged into ethanol with sonication for 10 minutes and are then rinsed with deionized water. This cleaning removes organic contaminants and enables the formation of sufficient hydroxyl groups —OH on the surface of the fine layer of silica to react with the precursors during the reactions caused by the ALD method.

Precursors.

Organometallic precursors are used: nickel acetylacetonate and cobalt acetylacetonate, which are stable and inexpensive molecules with low toxicity that are easy to store.

The nickel and cobalt acetylacetonate are purchased commercially (Sigma-Aldrich) in powder form.

The powders are then charged in a rod that will be added to the hot solid source. To evaporate the precursors, this source is heated at 170° C. for nickel and to 180° C. for cobalt. With these temperatures a large quantity of material evaporates without decomposition. The vapour will be transported to the reaction chamber by nitrogen flow.

Reactants.

Methanol, ethanol and propanol are used here as reactants for reducing the nickel acetylacetonate and cobalt acetylacetonate vapours already adsorbed on the surface of the substrate. These alcohols with purity 99% are purchased commercially (Sigma-Aldrich).

The dehydrogenation of alcohols is a process that was implemented for the production of aldehydes and ketones. The capacity of alcohols to undergo dehydrogenation depends greatly on their structure and the temperature. This process is also catalysed by transition metals or by complexes bound to transition metals.

The reaction mechanism is described as follows: the —OH groups on the surface of the samples are partially ionized. The adsorption of $M(acac)_2$ on the surface of the silicon oxide is made possible by the fact that these —OH groups accepted the axial ligand of the M(II). This causes metal coordination with an acetylacetonate ligand on the surface and the release of an acetylacetone molecule. The formation of an acetylacetone molecule is due to the strong interactions between the protons on the surface —OH groups and the system of electrons in the acetylacetonate ligands. The adsorbed M(acac) is then reduced by hydrogen atoms after interaction with the alcohol.

For each ALD process, a protocol with the deposit parameters in the form of a sequential computer program is used. This programme controls valve opening for each pulse and purge, the heating temperatures and durations in the reaction chamber and sources of heat, carrier gas flows, the number of cycles and the pulse time for each precursor. For deposits on flat substrates, the deposit temperature was varied between 200° C. and 390° C. The pulse and purge times ranged from 0.1 s to 4 s and the final choice depended on the growth rate and the target morphology for the films. The carrier gas flows are set at 300 sccm, sufficient to transport the precursors to the reactor. The number of ALD cycles was varied from 100 to 4000 depending on the film thickness or the target shapes.

Deposit on Diatoms.

A procedure analogous to that on flat substrates is used except that the diatoms are in powder form, which implies the use of an internal fluidized bed. The processes for deposition on powders use the same precursors as deposition on flat substrates. However the typical process parameters for deposition on diatoms need optimization.

Growth of Carbon Nanotubes.

As for the preparation of catalyst particles, the CNTs are first grown on flat substrates (oxidized silicon) to determine the optimal value for growth parameters. Then secondly, they are grown on the diatoms in 3D configuration. The catalytic chemical deposition method (CCVD) is used in a MC200 device made by Annealsys to treat the flat substrates. By contrast a fluidized bed reactor is used for the growth of CNTs on diatoms.

Growth of CNTs on Flat Substrate.

The Annealsys MC200 machine is an MOCVD reactor (Metal Oxide Chemical Vapour Deposition) with controlled wall temperature. The MC200 machine is configured as follows:

Stainless-steel reactor with temperature-controlled walls and heated substrate holders for wafers up to 200 mm in diameter.

Heated substrate holders and plasma RF with a maximum temperature of 850° C.

A Kemstream VapBox 4000 vaporization system with 4 injection heads for liquid precursors and 6 process gas lines.

Growth of CNTs on Diatoms.

The diatoms are in the form of particles of powder comprised between 1 micron and 10 microns in diameter.

The growth of carbon nanotubes on these cannot therefore be made in a planar configuration but in a fluidized bed reactor.

From biphasic materials (CNTs grafted on diatoms) according to the protocol covered above and detailed below, the present invention focuses on the development of composites based on these biphasic materials.

After having produced a biphasic material (diatoms+carbon nanotubes), the next step is to integrate in a polymer matrix. For this a mixing technique must be chosen that ensures good dispersion of strengthening agents in the matrix without deterioration (CNT shear and separation from their silica substrate). The two materials are mixed by extrusion. A microextruder is used to mix the polymers and loads, and injection moulding to make test samples.

Extrusion Mixing.

A DSM Xplore Micro 15 twin-screw micro-extruder with a chamber with 15 mL capacity and 6 heating zones (with a maximum temperature of 350° C.) is used. The worm screw rotation rate can be set and may vary from 1 to 250 rpm. A water circuit is used for cooling. At the exit of the extruder, a 3 mm diameter ring is obtained.

The heating temperature and the screw rotation rate are set first. The temperature is set such that it coincides with the polymer's melting temperature (180° C. for PMMA). The rotation rate of the screws (that turn in the mixture chamber) is set and as a function of the density of the polymer and loads, the shear force is automatically calculated by the device. The products to be mixed are then weighed (the polymer and the load) since they are solid, and then added through the injector in small quantities. The products are mixed inside the chamber for a long enough period to homogenize them (5 minutes). The ring is recovered at the end of mixing.

Sample Development.

After having mixed the polymer and the loads, the product obtained is shaped with the goal of making samples intended for mechanical and electrical analyses. For the composite based on PMMA and biphasic material, an injection press is used for shaping.

A Thermo scientific HAAKE Minijet II injection moulder with dimensions 300 mm×460 mm×710 mm is used. The injection uses a plunger with maximum pressure of 1200 bar. The air pressure may range up to 10 bar. Several moulds with different shapes may be used to make several sample types; the moulds may be heated to 250° C. The pressure and duration of the injection are chosen to ensure sample reproducibility.

The materials to inject are first added and melted in a cylinder that can be heated to 400° C. This cylinder is placed above the mould. The plunger applies pressure to the cylinder to push its contents to the mould to be filled.

Characterization Technique.

Scanning Electron Microscopy (SEM).

During this work, SEM observations were made with a Helios Nanolab 650 microscope. The thin layer samples were deposited directly on an aluminium support attached by double-sided carbon adhesive tape. The diatom powder on which the nanotubes are formed is also directly deposited on the adhesive tape to be analysed. The SEM images shown in this text have been recorded with a 2 kV acceleration voltage and a 25 mA intensity.

SEM is perfectly suited to the observation of morphologies of thin layers, catalyst particles and also carbon nanotubes. This technique gives information on the density and size of nanoparticles and carbon nanotubes, and produces images of structures with sizes ranging up to 10 nm. SEM also provides information on how the nanotubes are dispersed in the polymer matrix, crucial information for understanding the composite's physical properties.

Transmission Electron Microscopy (TEM).

Because of its high spatial resolution, TEM provides information of the atomic order. It can distinguish single-walled and multi-walled nanotubes and show defects on the tubes. With TEM, it is possible to distinguish the following structures: nanotubes, fibres, bamboo structure, etc. This imaging also allows the evaluation of how the nanotubes are dispersed in the PMMA. TEM analyses were done using a LEO 922 OMEGA equipped with a field emission gun with an acceleration voltage that can range up to 200 kV, EELS detectors (electron energy loss spectrometer), X-rays, SE (secondary electron), and BSE (back-scattered electrons). The instrument resolution was 0.29 nm.

The composite samples (PMMA+biphasics) were cut into thin slices 70-100 nm thick by a microtome. Powdered samples were deposited directly on the TEM grid.

X-Ray Photoelectron Spectroscopy (XPS).

XPS is a chemical analysis technique for surfaces where the sample is irradiated by monochromatic x-rays. Through a photoelectric effect, these cause atoms to ionize. This provides information such as the chemical composition of the materials (thin layers). XPS is perfectly suited for knowing the chemical composition of the nanoparticles of catalyst and metal thin films that have been used to catalyse the growth of carbon nanotubes. The analyses were done with a Kratos Axis Ultra DLD device equipped with an x-ray tube (Al Kα with energy hv=1486.6 eV) with power of 150 W; energy analyser formed of two hemispheric electrodes; an acquisition and data processing system that acquires high resolution spectra (energy 40 eV) and global spectra (energy 160 eV). The instrument has spatial resolution of 10 μm (spectroscopy) and 3 μm (imaging); the sensitivity limit is 0.5. The bond energies are calibrated on the bond energy of carbon 1s.

The mechanical properties are studied through traction tests on samples made by injection. These tensile tests show how stress changes as a function of strain. The mechanical behaviour of the material manifests by the properties of the stress-strain curve, from which the tensile strength, the breaking strength and the maximum elongation of the material before it breaks. From this curve three domains corresponding to the material's elasticity zone, plastic deformation zone and break zone can also be determined.

To measure the materials' resistivity, the Van der Pauw method was used.

The thermal stability of the composite materials was measured through their behaviour under the effect of heat. Thermogravimetric analysis (TGA) is often used to determine the characteristics of the materials that are related to their mass loss. This mass loss is due to decomposition, oxidation, etc. of components in the material under the effect of temperature. TGA was used to investigate the thermal stability of composites through their mass loss. The device used is a Netzsch-STA 409 PC, with an air flow of 100 $cm^3.min^{-1}$ in an aluminium crucible containing 20-25 mg of sample. The measurements were made under dynamic conditions with a temperature ramp of 10° $C.\cdot min^{-1}$.

To determine the optimal growth conditions on diatoms of a high surface density of multi-walled nanotubes also with as few defects as possible, the process was first developed on flat substrates. An oxidized silicon substrate including on the surface a layer of 50 nm of silicon oxide $SiO_2$ was selected to reproduce the chemical nature of the shell of the diatoms, which is formed of about 50 nm silicon oxide.

The preparation of nickel and cobalt catalysts is described. ALD of Ni(acac)$_2$ and Co(acac)$_2$ reduced by alcohols is used on silicon oxide substrates. This process has been developed before for CVD [113] but was developed for the first time for ALD. The growth of carbon nanotubes by CVD on catalytic nanoparticles prepared by ALD, CVD and vapour impregnation is then presented.

Preparation of Catalysts.

The growth of carbon nanotubes is catalysed by cobalt and nickel nanoparticles prepared by the ALD technique.

Nickel Deposit by ALD.

With the goal of characterizing their chemical composition, their crystalline structure and morphology, films with thickness ranging from 10 nm to 100 nm have been deposited. Nickel acetylacetonate was used as precursor and alcohols (methanol, ethanol and propanol) were used as reducing agents. The films were deposited on silicon oxidized thermally at 1100° C., with a thickness of 50 nm of SiO$_2$ sufficient to stop all nickel diffusion in the substrate. The Ni(acac)$_2$ was in powder form and was sublimed at 180° C.; the alcohols were evaporated at ambient temperature. The reactor purge was ensured by continuous nitrogen flow of 300 sccm. An ALD cycle comprises a Ni(acac)$_2$ pulse (pulse time $t_{Ni}$) and an alcohol pulse (pulse time $t_{alcohol}$) separated by a reactor purge (purge time $t_P$). The purge time is set at 2 s and the Ni(acac)$_2$ and alcohols pulse times vary between 0.1 and 4 s. The deposit temperature varies between 200° C. and 300° C.

Film Growth.

FIG. 3 shows the increase in film growth rate (defined here in ng/cm$^2$/cycle) as a function of alcohol injection time ($t_{alcohol}$) for the three alcohols with increasing chain length. This increase has already been observed by Premkumar and his collaborators in the scope of a CVD process using Co(acac)$_2$ as precursor (Premkumar P. A., et al., *Chem. Vap. Depos.*, 2007, 13, 219-226). This is attributed to incomplete dissociation of the alcohol during the process leading to carbon incorporation in the film and consequently to increased film mass. Moreover the nickel acetylacetonate adsorbed onto the surface by alcohols is reduced via hydrogen atoms coming from the alcohol groups. The reactivity of primary alcohols was studied as a function of their chain length: it has been demonstrated that propanol provides a proton in various instances in comparison with other alcohols (Premkumar P. A., et al., *Chem. Mater.*, 2007, 19, 6206-6211). This could also explain the fact that the growth rate obtained with propanol is greater than that obtained with ethanol, itself greater than that obtained with methanol.

Chemical Composition and Crystalline Structures of the Films.

The films were chemically analysed using XPS, in combination with ionic bombardment to probe the composition through its thickness. Accordingly, high quantities of carbon (70-80%) have been detected on the surface and deep down in the films synthesized with ethanol and propanol as reducing agents (FIGS. 4a and 4b). By contrast, using methanol, nickel films with purity around 95% were obtained, and carbon was principally present on the surface of the film in the form of carbon contaminations (this contamination is usual in XPS and comes from atmospheric molecules that may be adsorbed on the surface of samples while they are handled) (FIG. 4c).

The increased carbon quantity is correlated with that of the growth obtained using ethanol and propanol relative to methanol.

It has been shown that the dehydrogenation of primary alcohols provides hydrogen, CO, CO$_2$, aldehydes and other fragments that come from their decomposition. Using methanol which only has one carbon atom in its structure is therefore favourable to reduce carbon contamination on the film and then produces the growth of a metal nickel film.

Carbon is the principal element present on the surface of the film formed with methanol as reducing agent but then in the core of the film, nickel becomes the major element until the silica layer is reached. By contrast, for films deposited using ethanol and propanol, carbon is the dominant element on the surface and in the film, until the silica layer. The XPS spectra for the core levels of carbon and nickel are shown on FIG. 5. The fine structure of the peak in the Ni2p core shows that this element is in the form of reduced nickel (metallic) for all the films. The bond energy of Ni 2p3/2 in its metal phase has been reported at 852.8 eV and is different than that of its oxide phases (854.6 eV for NiO; 855.7 eV for Ni$_2$O$_3$ and 856.45 eV for Ni(OH)$_2$).

The XPS spectrum of Ni 2p3/2 in its metal phase has a satellite peak at +6 eV that has been attributed to energy losses in plasmons and to interband transitions. This satellite peak is found on the Ni 2p spectrum of the film deposited using methanol as reducing agent (FIG. 5 in insert). With ethanol or propanol, the satellites peaks are shifted by 1 eV towards higher bond energies. This effect has also been observed on a nickel carbide and carbon composite deposited by a spraying process. The authors attributed it to the presence of carbon in the nickel crystalline phase that changes the electrostatic shielding of the 2p electrons (Abrasonis G., et al., *X-Ray spectroscopic and magnetic investigation of C*, 2008, 112, 12628-12367). From these results, the conclusion is that using propanol or ethanol leads to the formation of nickel carbide but using methanol leads to metallic nickel forming.

ALD of Cobalt.

The chemical structure and morphology of the films deposited using cobalt acetylacetonate reduced by methanol, ethanol and propanol are presented.

FIG. 6 shows the XPS analyses of films deposited from Co(acac)$_2$ and the three alcohols as reducing agents. By contrast with the nickel films, carbon is present in all the films with a concentration greater than 50%. As for the cobalt concentration, it increases depending on the alcohol used: 25% with methanol, 40% with ethanol and 50% with propanol. None of the alcohols used completely reduces the Co(acac)$_2$ until a purely metallic film is obtained. The films deposited with propanol were selected for studying the crystalline structure of the thicker deposits.

FIG. 7 shows the C 1s and Co 2p spectra of films deposited at 350° C. before and after ionic bombardment of the surface. The intensity of the C 1s carbon peak on the surface of the film (bombardment time 0 s) is higher than that in the film (bombardment time 300 s) because of the surface contamination by ambient air. The maximum and the peak shape are respectively shifted and broader after 300 s of bombardment. By using spectral decomposition using mixed Gaussian-Lorentzian function, the presence of two contributions at 284.4 and 283.5 eV is demonstrated (FIG. 7b). These correspond respectively to C—C and C—Co bonds. This indicates that a fraction of the carbon contained in the film is bonded to the cobalt to form a carbide type phase. The bond energies for Co 2p3/2 and Co 2p1/2 (FIG. 7c) after 300 s of bombardment are measured at 778.4 and 793.4 eV and correspond to the metallic cobalt phase. As well as the metallic phase, two shoulders are measured at 780.8 and 796.8 eV associated with their respective satellite at 787.7 and 804.2 eV and correspond to a cobalt oxide phase.

It has been demonstrated that when ALD with Ni(acac)$_2$ is reduced by methanol it can produce a metallic Ni phase, and when it is reduced by ethanol and propanol it can produce Ni carbide. The reaction of Co(acac)$_2$ with the three alcohols systematically produces cobalt carbide, including with methanol. However, this cobalt carbide phase is not prohibitive to its use as catalyst for growing carbon nanotubes. Finally, the process of growing CNTs uses a reduction step with hydrogen before the growth that allows the activation of metallic or carbon-containing catalysts.

FIG. 8 shows the growth procedure for carbon nanotubes on a flat substrate.

Preparation of Catalytic Nickel Particles

Layers of nickel deposited from Ni(acac)$_2$ reduced by methanol and layers of Ni carbide from Ni(acac)$_2$ reduced by ethanol were used. Non-saturation conditions were used to produce well separated nanoparticles on the surface of the substrate and saturation conditions were used to deposit a film that covers the surface of the substrate well, for each type. For the non-saturation conditions, the parameters are as follows: 1 s of Ni(acac)$_2$ pulse time, 1 s of alcohol pulse time, 2 s of purge and 1000 cycles at 300° C. For saturation conditions, the parameters are as follows: 2 s of Ni(acac)$_2$ pulse time, 2 s of alcohol pulse time, 2 s of purge and 3000 cycles (~30 nm for ethanol, ~15 nm for methanol). FIG. 9 shows the different deposit morphologies depending on the saturation parameters. The Ni-Meth-1000 cycles shows smaller particles that the Ni-Eth-1000 cycles; the nickel deposits from Ni(acac)$_2$ reduced by methanol have a lower growth rate. Because of this, the thickness of the Ni-Eth-3000 cycles film is higher than that of the Ni-Meth-3000 cycles film.

Nanotube Growth Catalysed by Nickel.

FIG. 10 shows the SEM images of carbon structures synthesized at 500 and 700° C., 10 minutes reduction with hydrogen at concentration (H$_2$: N$_2$)=10:90. The growth time is 10 minutes, the acetylene concentration (C$_2$H$_2$: N$_2$)=10:90. The pressure in the reaction chamber is 13 mbar. The growth was done on nickel nanoparticles deposited by ALD at 1000 and 3000 cycles.

The nanotube synthesis tests done on the particles deposited at 1000 cycles at 500 and 700° C. were not successful. On the samples deposited at 3000 cycles, crooked structures were obtained as previously at 500° C. By contrast at 700° C., nanotubes were obtained but with low surface density compared to the nanotube carpets obtained with cobalt.

It has been demonstrated that ALD of Ni(acac)$_2$ and ethanol gave nickel carbide. By using the same conditions as previously, there was no growth on the samples deposited at 1000 cycles ALD at 700° C. and a few well dispersed structures (fibres or tubes) at 500° C. For the samples deposited at 3000 cycles, a few structures (certainly fibres) were observed on the surface. By contrast at 700° C., there was no growth apart from a few long structures on the surface.

Preparation of Catalytic Cobalt Particles.

FIG. 11 shows different types of cobalt films deposited by three different processes: CVD, ALD and vapour phase impregnation. Deposits by CVD were made from a solution of Co(acac)$_2$ and ethanol. The Co(acac)$_2$ powder was dissolved in ethanol to make a solution at 5 mmol·L$^{-1}$. This solution is injected for 10 or 40 min on a silicon oxide substrate heated to 300° C. ALD was achieved by reacting Co(acac)$_2$ and ethanol at 1 s injection time for Co(acac)$_2$, 2 s injection time for ethanol, 2 s purge time. 1000 cycles and 4000 cycles were used. Vapour phase impregnation consists in injecting the Co(acac)$_2$ vapour sublimed at 155° C. for 150 s.

As expected, in the case of impregnation, no nanoparticles are observed in SEM. By contrast FIG. 11 shows the presence of such nanoparticles for the ALD sample done at 1000 cycles (4 nm to 8 nm diameter on average), and the one done at 4000 cycles (between 6-8 nm average diameter). These values are extracted from SEM images by the software program image-J. Regarding the samples deposited for 10 minutes and 40 minutes by CVD a clear morphology difference was noticed. After 10 min, homogeneous distribution of nanoparticles (average diameter 2 nm to 4 nm) was observed whereas 40 minutes of deposit led to the coalescence of previously formed nanoparticles and to the formation of aggregates.

Nanotube Growth on Particles Deposited by CVD.

Carbon nanotubes were grown using first a step of reduction with hydrogen for 10 minutes at concentration (H$_2$: N$_2$)=10:90 (partial pressure ratio), followed by a step of growth using acetylene as carbon source. The growth time is 10 minutes, the acetylene concentration (C$_2$H$_2$: N$_2$)=10:90. The total pressure in the reaction chamber was 13 mbar. The growth temperature varied from 500° C. to 800° C.

FIGS. 12 and 13 show the TEM images of samples synthesized at 500° C. and 700° C., respectively. FIG. 12 shows carbon fibre type structures with large diameter (~80 nm) and typical length ~150 nm. At 500° C., the Co nanoparticle (clearly observed on image 18 left panel) catalyses tip-growth of carbon fibres. The CNTs growth regime requires minimum temperatures of the order of 700° C. as confirmed by the photographs in FIG. 13. For this temperature, the structures characteristic of single- and double-walled carbon nanotubes are demonstrated. Their diameter varies between 1 nm and 3 nm with a few structural defects in particular observed on the double-walled nanotubes. It is remarkable to note that the growth regime changes significantly with temperature given the passage from a tip-growth mode at 500° C. for the carbon fibres to a bottom-growth mode at 700° C. for the nanotubes. Indeed, for the latter, no particle is observed at the free ends of the nanotubes.

These observations confirm the previous statistical analyses and highlight the need to work at minimum temperatures of 700° C. when Co catalysts synthesized by CVD are common.

Nanotube Growth on Particles Deposited by Vapour Phase Impregnation.

FIG. 14 shows the SEM images of nanotubes synthesized at different temperatures on substrates impregnated with Co(acac)$_2$ vapour sublimed at 170° C. The pressure in the reaction chamber was 13 mbar. The temperature varied from 500° C. to 800° C.

At 500° C., almost no growth was observed, only very small structures at a few places in the sample and a thick and crooked structure (>30 nm) are present. At 600° C., there was a denser distribution of small structures that were combined with either nanofibres or crooked nanotubes. At 700° C., finer, well dispersed structures with high density were obtained. At 800° C. similar structures were observed but with much lower density than at 700° C.

Therefore we conclude that at 500 and 600° C., the activation energy of the catalysis activity was not reached.

FIG. 15 shows the morphology of nanotubes obtained at 700° C. The presence of bundles of single-walled nanotubes that seem to be well crystallized and without too many particles or amorphous carbon deposits or onions is observed.

Nanotube Growth on Particles Deposited by ALD.

FIG. 16 shows SEM images of carbon nanotubes synthesized at 500° C. and 700° C. As previously, at 500° C., the presence of fibrous structures is suspected. By contrast at 700° C., a dense carpet of nanotubes that coats the entire surface of the sample is obtained.

The TEM images presented in FIG. 17 confirm the fibrous structures suspected on the sample synthesized at 500° C. At 700° C., the carpet of nanotubes corresponds to multi-walled CNTs with a few defects on the exterior walls and diameter between 15 nm and 20 nm. The growth mode is top-growth.

To summarize, a mixture of single- and double-walled nanotubes are obtained from 600° C. with the CVD samples. The growth of carbon nanotubes on the samples made by impregnation leads to bundles of single-walled tubes and a few double-walled tubes. As for the sample made by ALD 4000 cycles (average particle size around 8 nm), it provided a "high" multi-walled carpet of nanotubes. These results confirm that the growth of single- or multiple walls is also influenced by the size of the catalytic particles, even though other parameters such as temperature, carbon source concentration and the reduction also play an important role.

Size of Catalysts and Morphology.

The sample made at 1000 cycles of ALD gave the same structures as those observed on CVD at 700° C., single-walled or double-walled nanotubes, which correlates the influence of particle size, which is about 4 to 8 nm average diameter, well. Moreover the sample at 4000 cycles gave a carpet of multi-walled tubes as observed in FIG. 18.

Growth Time.

FIG. 19 shows that after 3 minutes of growth (at constant parameters), a carpet of nanotubes was already forming. The carpet became thicker and thicker with increasing growth time.

Reduction Time.

The hydrogen reduction time preceding the growth step was investigated here, keeping all parameters constant. FIG. 20 shows the SEM images of nanotubes synthesized at reduction times of 0 minutes, 10 minutes and 20 minutes. Without a reduction step, low nanotube density was observed at the sample's surface. By contrast, at 10 minutes and 20 minutes, a carpet of multi-walled nanotubes was generated. The role of the hydrogen reduction is to clean the surface of the particles and to reduce the oxidized particles. In the absence of hydrogen, the oxidized particles and those contaminated on the surface are not activated, which leads to very low nanotube density.

Acetylene Concentration.

FIG. 21 shows the SEM images of nanotubes synthesized at different acetylene concentrations, keeping the same conditions as previously. A concentration of 2%, 10% and 30% acetylene in nitrogen was used, and we observed that this concentration significantly influenced the surface density of the nanotubes. At 2%, the process provided much lower density than at 10%. In these conditions, there are not enough carbon atoms to react with the particles. It was moreover shown that at low precursor concentration, the amount of carbon available to react with the catalytic particles was low, leading to low growth. Moreover at 30%, a low nanotube density was also obtained: at high acetylene concentration, the carbon atom concentration available becomes very high, the dissolution level becomes high compared with the precipitation content and the diffusion level. This causes carbon to accumulate on the surface of the particle and accelerates its oversaturation and loss of catalytic activity, which leads to low nanotube density.

The cobalt carbide particles were deposited on diatoms by ALD in an internal fluidized bed configuration. The precursor used is cobalt acetylacetonate, and the reducing alcohol is ethanol.

FIG. 22 shows the SEM images of deposits made at 250° C., 300° C. and 350° C. The precursors' exposure times (cobalt acetylacetonate and ethanol) were 20 s each as was the purge time; the number of cycles was 115. No deposit was observed at 250° C.; growth of cobalt carbide nanoparticles on the surface of diatoms is only observed from 300° C. During growth by ALD, the activation energy must be high enough to allow the growth of the first atomic layers. So the role of temperature is to activate the adsorption of precursors on the surface of the substrate and reaction between the two precursors. What is more, raising the temperature boosts surface migration of cobalt atoms and leads to the formation of films or nanoparticles.

The morphology of deposits made at 300° C. by varying the number of cycles is illustrated in FIG. 23. At 115 cycles, less dense, well dispersed particles were observed. FIG. 23 also reports the particle size distribution as a function of the number of cycles obtained after extraction and processing of SEM images by the software program Gwyddion. From 115 to 600 ALD cycles, there was a slight increase in the average particle size. This agrees with the results reported in the literature that show that in ALD processes, the particle size and consequently the film thicknesses increase with the number of cycles.

The size and density of the catalytic particles will be parameters that greatly influence the dimensions and density of the carbon nanotubes. These two catalyst characteristics may be controlled from the parameters of the ALD process.

Growth of Carbon Nanotubes.

Influence of Growth Temperature.

FIG. 24 shows TEM images of tubes formed at different temperatures.

At 500° C., the images show short, crooked structures. At 600° C., the sample was essentially constituted of multi-walled nanotubes with many defects causing sizeable elbows. At 700° C., a mixture of single-walled and multi-walled nanotubes with low diameter was observed. The sample synthesized at 800° C. also shows single-walled and multi-walled nanotubes with larger diameters than those of the 700° C. samples.

Influence of Growth Time.

The influence of growth time was studied at the temperature of 600° C., with a reduction time of 20 minutes under hydrogen, growth using a 20% mixture of hydrogen in $N_2$ and 20% acetylene in $N_2$. FIG. 25 shows TEM images of the morphology of nanotubes at 5, 20 and 40 minutes' growth. At 5 minutes' growth, the tubes are relatively short compared to those synthesized at 20 minutes and 40 minutes. The number of nanotubes seems to be higher at 40 min of growth but this does not confirm that diatoms are 3D structures because the TEM images are only a 2D projection. It has been demonstrated by several authors that nanotube density and length increases as growth time increases.

From TEM images, it is possible to observe that the majority of nanotubes present are MWNTs.

Influence of Acetylene Concentration.

Three acetylene concentrations (5%, 20% and 40%) in $N_2$. FIG. 26 shows TEM images of the morphology of nanotubes as a function of this concentration. At 5% acetylene, a very low growth rate was observed and there were very few nanotubes. MWNT tubes were observed on the samples at 20% and 40%. So increasing the concentration of the carbon source boosts MWNT growth.

Influence of Reduction Time.

Keeping all parameters constant: temperature at 600° C., growth time at 20 minutes, acetylene concentration at 20 mol % in $N_2$, hydrogen reduction time was varied at 0 minutes, 5 minutes and 20 minutes to study its influence on nanotube morphology.

The TEM images presented in FIG. 27 show MWNTs. On the CNTs, black dots without hydrogen reduction are observed. These are certainly metal particles. At 20 minutes the nanotubes have few defects and seem to be less polluted by these particles.

Growth of Carbon Nanotubes on External Fluidized Bed (Single Step).

In the previous section, the influence of growth parameters on nanotube morphology has been demonstrated but this was done on small quantities of diatom powders (a few mg). It is impossible for reasons related to machine limitations to make ALD deposits of nanoparticles on a large quantity of powders (5 g). An external fluidized bed system was put in place to deposit the cobalt particles by vapour-phase impregnation followed by the nanotube growth process on 5 g of diatom powder without putting air back in the system, so avoiding all risks of contamination by unwanted particles, such as for example dust. This process was called a one-step synthesis and also corresponds to a one-pot synthetic process.

The Co(acac)$_2$ is heated to 170° C. (evaporation temperature), then a nitrogen flow of 200 sccm is added to transport the Co(acac) vapour to the suspended diatom particles (fluidization) for 10 minutes. Next, the reduction step is performed by adding hydrogen diluted to 20% in nitrogen at 600° C. for 20 minutes. Next, the acetylene, also diluted to 20% in nitrogen, is added for 40 minutes.

FIG. 28 shows SEM images of CNTs synthesized on diatoms with the parameters selected previously. High CNT density of some diatoms and low density on others is noted. The coverage level is not 100%. Some diatoms were perhaps not sufficiently exposed to the precursor gases.

FIG. 29 shows the thermogravimetric analysis of the sample presented in FIG. 28. The mass loss was measured using a Netzsch-STA 409 PC device, with an air flow of 100 cm$^3$.min$^{-1}$ in an aluminium crucible containing 20-25 mg of sample. The measurements were made under dynamic conditions with a temperature ramp of 10° C.·min$^{-1}$.

From 550° C., the nanotubes (and probably the deposit of carbon residue) were completely oxidized, which means that the coverage can be approximated at 6% by mass relative to the diatoms.

The biphasic materials based on silica (diatoms) and carbon nanotubes that comply with the present invention are in particular used as a strengthening agent in composite materials based on polymers, more particularly based on elastomers.

These strengthening agents present remarkable properties, including in particular increasing the specific surface area for silica-based material due to the introduction of carbon nanotubes, supplying electrical and/or thermal properties to silica-based materials.

Two distinct polymers were used, to integrate the biphasic silica-based materials and carbon nanotubes. The two polymers were polymethylmethacrylate (PMMA) as model matrix used in the literature (Mathur R. B., et al., *Polym. Compos.*, 2008, 29, 717-727). Given the abundant literature on PMMA-carbon nanotube composites, PMMA is a good reference material for evaluating the supply of biphasic loads in improvement of PMMA's mechanical, thermal and electrical properties.

Next, a styrene-butadiene type elastomer (SBR, styrene-butadiene rubber) similar to what the tire industry uses in their formulation.

Nanocomposites Based on PMMA and Biphasic Loads.

The mechanical and thermal properties of the composite based on PMMA and biphasics were studied. The mixtures were made at the temperature of 180° C. (sufficient to melt the PMMA) and at a rotation rate of 10 rpm, to prevent detaching the tubes from diatoms.

Thermal Stability

FIG. 30 shows TEM images of PMMA composite loaded at 10% by mass with biphasics obtained at an extruder screw rate of 10 rpm. The nanotubes form a continuous and uniform network around the diatom cores. Nevertheless, 10 rpm seems to be sufficiently high to "extract" a few isolated nanotubes from the diatoms. The biphasic diatom loads/CNTs are dispersed homogeneously in the PMMA matrix, with a high concentration of nanotubes around the diatom cores.

The thermal degradation of PMMA in an inert atmosphere has been widely studied in the literature. Thermal degradation of pure PMMA around 310° C. is observed in agreement with the data reported in the literature (290° C.-315° C.) (Costache M. C., et al., *Polym. Adv. Technol.*, 2006, 17, 272-280).

FIG. 31 also indicates the DTA (thermodifferential analysis) for PMMA, with it showing endothermic behaviour in thermal decomposition of PMMA in an inert atmosphere. This behaviour is associated with depolymerization of the main chain by the random breaking of C—C bonds and the formation of volatile methyl methacrylate monomers.

By adding pure diatoms (without grafted CNTs) to the PMMA, the degradation occurs at lower temperature, around 280° C. (FIG. 32).

It has been shown that the interaction between macroradicals (R) and oxygen is the more probable exothermic reaction for PMMA destabilization (Troitskii B. B., *Inhibition of thermo-oxidative degradation of PMMA and polystyrene by C* 60, 2000, 36, 1073-1084). The RO$_2$ radicals generated react with macromolecules to form polymeric hydroperoxide polymers. This leads to the formation of free radicals that initiate the PMMA degradation. The presence of oxygen tends to catalyse the PMMA depolymerization relative to a purely thermal decomposition.

In the presence of biphasic diatom/carbon nanotube loads, the thermal degradation temperature is greatly increased, by around 25° C. (FIG. 33). The presence of carbon nanotubes significantly increases the thermal stability of the PMMA even in the presence of cores of diatoms, which tend to destabilize this polymer matrix. The stabilizing effect of nanotubes in polymers is well known (Pande S., et al., *Polym. Compos.*, 2009, 30, 1312-1317) and could be attributed to the fact that they interact with the macroradicals to form less active compounds.

Looking at the TGA derivative, two degradation mechanisms are noted: the first occurs at around 310° C. and is near the characteristic depolymerization temperature for PMMA catalysed by the diatoms alone; another occurs around 375° C. and is attributed to the neutralization of free radicals that bind with the carbon nanotubes (surface trapping).

This stabilizing effect of nanotubes has been confirmed by mixing only multi-walled carbon nanotubes and PMMA (FIG. 34) according to the same mixing conditions. In this case, a single degradation mechanism that occurs around 375° C. is identified and attributed to radical neutralization mechanisms by multi-walled nanotubes. At 1% of biphasic loads, a slight stabilization is observed relative to the diatoms. So, at this mass concentration of biphasic loads, the effect of nanotubes is not sufficient to compensate for the effect of diatoms and to increase the composite's stability relative to PMMA.

The diatoms have a catalytic effect that accelerates the thermal degradation of the composite and reduces its thermal stability relative to PMMA alone. The nanotubes have the reverse effect; they tend to increase the thermal stability of the composite and may even compensate for the effect of diatoms at 10% strengthening when biphasic loads are used. At low levels of strengthening, however, the effect of diatoms takes over from the nanotubes (FIG. 34).

Mechanical Properties

The mechanical properties of PMMA composites strengthened by diatoms and biphasic loads at 10 rpm are presented in FIG. 35. For each nanocomposite material, the three samples reproducible in terms of quantity of material or shape and size were measured.

These curves show how the material deformation has changed under the effect of mechanical strain. For all these materials, the break stress is very similar whereas the plastic deformation is clearly reduced when strengthening loads are integrated into the PMMA matrix. Three parameters are extracted from these curves: Young's modulus, which characterizes the material's rigidity, the break strength, which is the maximum stress reached during the traction test (also called tensile strength or Rm) and finally the deformation or elongation of the material when it breaks. These three parameters are relevant for correctly expressing the mechanical properties of nanocomposites based on PMMA strengthened by diatoms and biphasic loads (diatoms+carbon nanotubes). How they vary as a function of the concentrations of diatoms and biphasic loads is presented in FIGS. 36 and 37.

The elastic modulus (FIG. 36) passes from 2639 (+/−13) MPa for PMMA to 2793 (+/−10) by adding 4% of diatoms to PMMA, i.e. a 6% increase. At 10% of diatoms, we observe an increase of 11% more. The tensile strength Rm does not change relative to that of PMMA at 4% or at 10%. Reduced elongation is observed; it passes from 0.06 (+/−0.003) for PMMA to 0.037 (+/−0.001) at 4% diatoms and 0.033 (+/−0.001) at 10% of diatoms.

Globally, adding diatoms to the PMMA increases the Young's modulus of the composite (which increases with the diatom concentration). This increase may range up to 24% relative to PMMA. The break strength does not change even when the load concentration is increased. Moreover, the elongation at break reduces as the quantity of diatoms increases (FIG. 36). This reduction of elongation with increased diatom concentration is logical. The interface between the matrix and the inclusion is a stress concentration zone that causes break points.

At low concentration of biphasic loads, the Young's modulus increases, the Rm value does not change, and elongation decreases. From 10% the Rm value falls remarkably (−16%), which means deterioration in the composite's mechanical properties. This effect, which visibly comes from the CNTs, is due to their poor dispersion in the PMMA. Indeed CNTs tend to organize into networks around the diatoms, so at higher concentration residual stress increases at the load-matrix interfaces which reduces the composite's strength.

Nanocomposites based on SBR and biphasic loads (diatoms+carbon nanotubes).

The production of nanocomposites based on SBR strengthened with glass fibres and biphasic loads is described. The mixing temperature was set at 90° C., the rotation rate at 10 rpm. Vulcanization agents such as cyclohexyl-benzothiazyl sulphonamide (CBS) and zinc dibenzyl-dithiocarbamate (ZBec) which accelerate vulcanization, and the main vulcanization agent, sulfur (S) were then added.

The dimensions of the samples were: 65 mm×10 mm×3 mm.

Thermal Stability.

The thermal degradation of the elastomer alone in an inert atmosphere is presented in FIG. 38. Three inflexion points are observed on the curve. Around 275° C., there is mass loss of 5%, due to losses of plasticizing oils that occurs at relatively low temperature. Around 430° C., the mass loss of 84% is due to the natural rubber degradation. On the DTA curve, a peak around 380° C. (~40% mass) and a peak at 480° C. (~30% mass) are observed, which means that we can conclude that natural rubber degradation occurs in two steps. Finally at 490° C., the 10% mass loss ought to correspond to inorganic loads.

Adding diatoms to SBR slightly reduces the thermal stability of the elastomer as FIG. 39 shows. Considering the temperature at the inflexion points, 1% of diatoms caused a shift of −24° C.; at 4%, the shift was −13° C. and at 10% of diatoms it was −14° C.

Adding biphasic loads to the SBR did not affect the composite's stability (FIG. 40). At 1% of loads, the shift was +2° C. But at 4 and 10% the reduction was respectively −3° C. and −10° C. Relative to the SBR loaded with diatoms, the biphasic loads only slightly increase the material's stability. The stabilizing effect of CNTs was not sufficient to compensate the destabilizing effect of the diatoms in the elastomer.

Mechanical Properties.

FIGS. 41 and 42 show the stress-strain curves obtained after stress tests on SBR alone and SBR strengthened at 1%, 4% and 10% by mass of diatoms and 1%, 4% and 10% of biphasics (diatoms+carbon nanotubes).

From these curves, the values of Young's modulus, tensile strength and elongation were extracted (FIGS. 43 and 44).

Adding diatoms (in increasing quantities) significantly increases the Young's modulus and the SBR's resistance to traction but reduces elongation relative to the SBR. The diatoms form a good interface with the SBR molecules.

Adding the biphasic enormously increased the Young's modulus, tensile strength and even the material's elongation. In all cases, there is some variability for a given concentration related to sample heterogeneity. At 1% of biphasics, Young's modulus increasing between 50% to 100%, strength increasing from 100% to 350% and elongation increasing from 10% to 42% were observed. At 4%, the Young's modulus increased between 170% and 270%, strength from 350% to 650% and elongation from 250% to 350%. At 10% of biphasics, an increase between 200% and 270% for the Young's modulus, between 500% and 700% for strength and between 350% and 400% for elongation were observed.

What CNTs add to the mechanical performances is therefore remarkable, they increased tensile strength between 6% and 11% relative to the SBR-diatom composite. As for elongation, it passes from 150% for 10% of diatoms to 400% at 10% of biphasics. The CNTs clearly improve the interface between the diatoms and the matrix.

Electric Properties.

Electric measurements were taken on three samples (FIG. 45): SBR, SBR loaded with 10% diatoms and SBR loaded with 10% of biphasics applying a voltage of 200 V with a two-point device. Only the third is a conductor; with conductivity of 2.5 $10^{-14}$ S at 10% of biphasic loads. This conductivity value of 0.6% by mass of CNTs in the composite is promising.

It could allow us to reach percolation levels with low concentrations of CNTs by optimizing the CNT growth process.

The invention claimed is:

1. A composite material comprising at least one polymer matrix, said polymer matrix comprising at least one inorganic load composed of a biphasic material, the biphasic material comprising at least one mesoporous substrate at least partially coated with carbon nanotubes wherein the at least one mesoporous substrate is a mesoporous substrate with non-organized porosity;
   wherein the mesoporous substrate with non-organized porosity comprises silica from diatoms,
   wherein a composition of the mesoporous substrate with non-organized porosity in the composite material is comprised between 2% and 10%; and
   wherein the polymer matrix is composed of polymethylmethacrylate and/or at least one elastomer.

2. The composite material according to claim 1, wherein the mesoporous substrate with non-organized porosity comprises diatomite.

3. The composite material according to claim 1, wherein the polymer matrix is composed of polymethylmethacrylate and/or butadiene styrene rubber.

4. The composite material according to claim 1, wherein the thermal degradation temperature of the composite material with a polymer matrix composed of polymethylmethacrylate increases by 25° C. relative to the thermal degradation temperature of the polymethylmethacrylate.

5. The composite material according to claim 3, wherein the Young's modulus of the composite material with a polymer matrix composed of butadiene styrene rubber increases between 50% and 300% relative to the Young's modulus of butadiene styrene rubber.

6. The composite material according to claim 3, wherein the electrical conductivity of the composite material with a polymer matrix composed of butadiene styrene rubber and a composition of diatoms of 10% is 2.5 10-14 S·cm-1.

7. The composite material according to claim 1, wherein the composition of the mesoporous substrate with non-organized porosity in the composite material is comprised between 4% and 10%.

8. The composite material according to claim 1, wherein the composition of the mesoporous substrate with non-organized porosity in the composite material is comprised between 5% and 10%.

9. The composite material according to claim 1, wherein the composition of the mesoporous substrate with non-organized porosity in the composite material is comprised between 6% and 10%.

10. A synthetic process for a composite material, said synthetic process comprising a step of extrusion between at least one polymer matrix and at least one biphasic material, wherein the composite material comprises the at least one polymer matrix, the polymer matrix comprises at least one inorganic load composed of a biphasic material, the biphasic material comprising at least one mesoporous substrate at least partially coated with carbon nanotubes, and wherein the at least one mesoporous substrate is a mesoporous substrate with non-organized porosity;
   wherein the mesoporous substrate with non-organized porosity comprises silica from diatoms,
   wherein the biphasic material is synthesized in the steps of:
   providing a catalyst on the at least one mesoporous substrate, the catalyst being configured to favor the growth of the carbon nanotubes and being reduced by an alcohol derivative; and
   growing the carbon nanotubes.

11. The synthetic process according to claim 10, wherein the steps of providing catalyst on the at least one mesoporous substrate and growing the carbon nanotubes are performed in a one-pot synthesis.

12. The synthetic process according to claim 10, wherein the step providing a catalyst on at least one mesoporous substrate is performed by vapor impregnation of the catalyst, by chemical vapor deposition or by atomic layer deposition.

13. The process according to claim 10, wherein the catalyst is a metal nanoparticle provided in a gas phase.

14. The process according to claim 10, wherein the catalyst is a nickel derivative, or a cobalt derivative.

15. The process according to claim 10, wherein the catalyst is Ni(acac)2 or Co(acac)2.

16. The process according to claim 10, wherein the alcohol derivative is a primary alcohol.

17. The process according to claim 10, wherein the catalyst and the alcohol derivative are applied simultaneously when the step of providing a catalyst on the at least one mesoporous substrate is performed by chemical vapor deposition.

18. The process according to claim 10, wherein the alcohol derivative is applied once the at least one catalyst is deposited on the at least one mesoporous substrate when the step of providing a catalyst on the at least one mesoporous substrate is performed by atomic layer deposition.

* * * * *